(12) United States Patent
Graczyk et al.

(10) Patent No.: US 10,058,011 B2
(45) Date of Patent: Aug. 21, 2018

(54) PASSIVE COOLING SYSTEMS FOR NETWORK CABINET

(75) Inventors: Frank J. Graczyk, New Lenox, IL (US); Samuel C. Ramey, Naperville, IL (US); James N. Fleming, Naperville, IL (US); Paul M. Herbst, Frankfort, IL (US); Michael J. McGrath, New Lenox, IL (US); Joseph D. Wentworth, Minooka, IL (US); Alva B. Eaton, Nottingham Park, IL (US)

(73) Assignee: Panduit Corp., Tinley Park, IL (US)

( * ) Notice: Subject to any disclaimer, the term of this patent is extended or adjusted under 35 U.S.C. 154(b) by 1708 days.

(21) Appl. No.: 12/486,061

(22) Filed: Jun. 17, 2009

(65) Prior Publication Data
US 2010/0003911 A1    Jan. 7, 2010

Related U.S. Application Data

(60) Provisional application No. 61/175,282, filed on May 4, 2009, provisional application No. 61/073,818, filed on Jun. 19, 2008.

(51) Int. Cl.
*H05K 7/20*    (2006.01)

(52) U.S. Cl.
CPC ............................ *H05K 7/20736* (2013.01)

(58) Field of Classification Search
CPC ......... G06F 1/20; H05K 7/20736; H05K 7/20
USPC ................... 454/184; 361/690, 695
See application file for complete search history.

(56) References Cited

U.S. PATENT DOCUMENTS

| | | | |
|---|---|---|---|
| 3,192,306 A * | 6/1965 | Skonnord | ............ 174/16.1 |
| 3,783,320 A * | 1/1974 | Clement | ............ H02G 5/08 |
| | | | 248/231.51 |
| 4,049,225 A | 9/1977 | Chasen et al. | |
| 4,644,443 A * | 2/1987 | Swensen | ............ H05K 7/20572 |
| | | | 174/16.1 |

(Continued)

FOREIGN PATENT DOCUMENTS

GB    2297152 A    7/1996
JP    2007316989 A    12/2007

OTHER PUBLICATIONS

Opengate Data Systems' Product Literature for SiteX EC Network Switch Cooling Series, 2 pages, Apr. 2008.

(Continued)

*Primary Examiner* — Steven B McAllister
*Assistant Examiner* — Samantha Miller
(74) *Attorney, Agent, or Firm* — Christopher S. Clancy; James H. Williams; Anthony Bartosik

(57) ABSTRACT

Certain embodiments of the present invention provide a cooling duct assembly for electronic equipment installed in a cabinet. The cooling duct assembly comprises at least one main duct in fluid communication with a front portion of the cabinet. The at least one main duct receives cold air from the front portion of the cabinet and routes the cold air toward a back portion of the cabinet. Additionally, the cooling duct assembly comprises at least one side duct in fluid communication with the at least one main duct. The at least one side duct receives the cold air from the at least one main duct and routes the cold air to at least one side air intake opening on the electronic equipment.

13 Claims, 33 Drawing Sheets

(56) References Cited

U.S. PATENT DOCUMENTS

| | | | |
|---|---|---|---|
| 4,797,783 A * | 1/1989 | Kohmoto | H05K 7/20572 361/688 |
| 5,150,277 A * | 9/1992 | Bainbridge | H05K 7/206 361/695 |
| 5,171,183 A * | 12/1992 | Pollard et al. | 454/184 |
| 5,237,484 A * | 8/1993 | Ferchau | G06F 1/20 165/80.3 |
| 5,398,159 A | 3/1995 | Anderson et al. | |
| 5,452,362 A | 9/1995 | Burward-Hoy | |
| 5,460,441 A * | 10/1995 | Hastings | G06F 1/184 312/138.1 |
| 5,482,109 A * | 1/1996 | Kunkel | H05K 7/20254 165/185 |
| 5,544,012 A * | 8/1996 | Koike | H05K 7/20572 165/122 |
| 5,796,580 A | 8/1998 | Komatsu et al. | |
| 5,851,143 A * | 12/1998 | Hamid | 454/57 |
| 6,011,688 A | 1/2000 | Thornburg et al. | |
| 6,130,820 A * | 10/2000 | Konstad | G06F 1/203 165/104.33 |
| 6,269,959 B1 | 8/2001 | Haworth | |
| 6,297,950 B1 * | 10/2001 | Erwin | 361/679.49 |
| 6,305,556 B1 | 10/2001 | Mayer | |
| 6,412,292 B2 | 7/2002 | Spinazzola et al. | |
| 6,494,050 B2 | 12/2002 | Spinazzola et al. | |
| 6,496,366 B1 | 12/2002 | Coglitore et al. | |
| 6,512,672 B1 | 1/2003 | Chen | |
| 6,525,935 B2 | 2/2003 | Casebolt | |
| 6,557,357 B2 | 5/2003 | Spinazzola et al. | |
| 6,574,100 B1 | 6/2003 | Anderson | |
| 6,574,970 B2 | 6/2003 | Spinazzola et al. | |
| 6,578,939 B1 | 6/2003 | Mayer | |
| 6,628,518 B2 * | 9/2003 | Behl et al. | 361/679.47 |
| 6,652,373 B2 | 11/2003 | Sharp et al. | |
| 6,678,156 B2 | 1/2004 | Moizer | |
| 6,685,033 B1 * | 2/2004 | Baddour et al. | 211/26 |
| 6,745,579 B2 | 6/2004 | Spinazzola et al. | |
| 6,747,878 B1 | 6/2004 | Hipp et al. | |
| 6,822,859 B2 | 11/2004 | Coglitore et al. | |
| 6,876,549 B2 * | 4/2005 | Beitelmal et al. | 361/692 |
| 7,033,267 B2 | 4/2006 | Rasmussen | |
| 7,112,131 B2 | 9/2006 | Rasmussen et al. | |
| 7,182,208 B2 | 2/2007 | Tachibana | |
| 7,184,267 B2 * | 2/2007 | Patel | 361/692 |
| 7,187,547 B1 | 3/2007 | French et al. | |
| 7,226,353 B2 * | 6/2007 | Bettridge | H05K 7/20736 361/695 |
| 7,254,022 B2 * | 8/2007 | Ebermann | H05K 7/20754 361/695 |
| 7,355,847 B2 | 4/2008 | Coglitore et al. | |
| 7,365,976 B2 | 4/2008 | Fujiya et al. | |
| 7,389,535 B2 | 6/2008 | King et al. | |
| 7,403,385 B2 | 7/2008 | Boone et al. | |
| 7,434,412 B1 * | 10/2008 | Miyahira | 62/115 |
| 7,486,511 B1 | 2/2009 | Griffel et al. | |
| 7,500,911 B2 | 3/2009 | Johnson et al. | |
| 7,542,287 B2 | 6/2009 | Lewis, II et al. | |
| 8,120,912 B2 * | 2/2012 | Aybay | H05K 7/20563 361/694 |
| 2003/0174466 A1 | 9/2003 | Hikawa | |
| 2004/0070936 A1 | 4/2004 | Coglitore et al. | |
| 2005/0157472 A1 | 7/2005 | Malone et al. | |
| 2006/0276121 A1 | 12/2006 | Rasmussen | |
| 2007/0129000 A1 | 6/2007 | Rasmussen et al. | |
| 2007/0171613 A1 | 7/2007 | McMahan et al. | |
| 2007/0223199 A1 * | 9/2007 | Fujiya et al. | 361/721 |
| 2008/0007911 A1 | 1/2008 | Hallin et al. | |
| 2008/0055850 A1 | 3/2008 | Carlson et al. | |
| 2008/0316702 A1 | 12/2008 | Donowho et al. | |
| 2008/0316703 A1 | 12/2008 | Donowho et al. | |
| 2009/0046423 A1 | 2/2009 | Hom et al. | |

OTHER PUBLICATIONS

Write Line's Product Literature for Airflow Manager for 1U Switches, 2 pages, Feb. 2009.

* cited by examiner

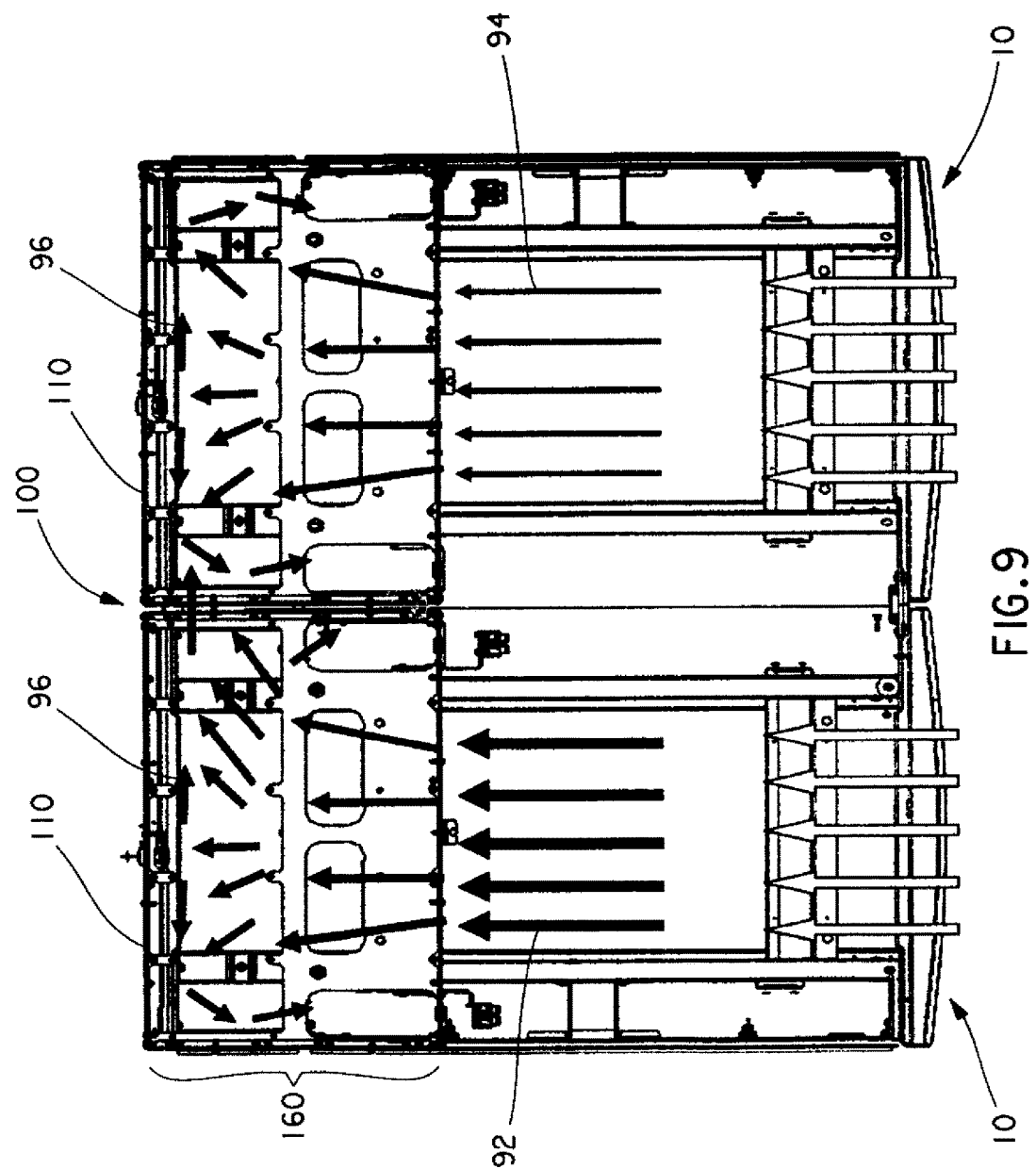

PASSIVE COOLING SYSTEMS FOR NETWORK CABINET

CROSS REFERENCE TO RELATED APPLICATIONS

This application claims priority to U.S. Provisional Patent Application No. 61/175,282, filed on May 4, 2009, and U.S. Provisional Patent Application No. 61/073,818, filed on Jun. 19, 2008, the subject matters of which are hereby incorporated by reference in their entireties.

SUMMARY OF THE INVENTION

Certain embodiments of the present invention provide a cooling duct assembly for electronic equipment installed in a cabinet. The cooling duct assembly comprises at least one main duct in fluid communication with a front portion of the cabinet. The at least one main duct receives cold air from the front portion of the cabinet and routes the cold air toward a back portion of the cabinet. Additionally, the cooling duct assembly comprises at least one side duct in fluid communication with the at least one main duct. The at least one side duct receives the cold air from the at least one main duct and routes the cold air to at least one side air intake opening on the electronic equipment.

BACKGROUND OF THE INVENTION

The present invention relates to network cabinets. More particularly, the present invention relates to passive cooling systems for network cabinets.

Network cabinets store and secure network components, such as servers and switches, which generate heat. As network technology advances, network components will generate more and more heat as a byproduct of higher speeds and improved performance. Therefore, cooling systems for network cabinets are essential to the development and integration of advanced network technology, both now and in the future.

Cooling systems for network cabinets are classified as passive or active. Passive cooling systems, such as perforated doors and chimneys, rely on ambient airflow to remove heat from the network cabinet. Conversely, active cooling systems rely on mechanical devices, such as fans and/or compressors, to cool the air and move it through the cabinet. Passive cooling systems are typically less expensive than active cooling systems, both to install and operate, but require more space than a comparable active cooling system. However, installing passive cooling systems in existing network cabinets is particularly difficult because existing network cabinets have limited space.

As previously mentioned, one example of a passive cooling system is perforated cabinet doors, which allow air to flow in or out of the cabinet. One drawback to perforated doors if the exhaust flow is not controlled properly is that hot air exiting the cabinet may be recirculated into the surrounding environment, and eventually, back into the cabinet. Chimneys have been added to control the removal of hot air from the cabinet. However, most network cabinets do not have enough space to accommodate an optimally sized chimney and corresponding exhaust plenum.

Network cabinets generate different amounts of heat at different times of day, depending on a number of factors, such as the type of network components installed in the cabinet and their particular usage requirements. Additionally, most data centers include more than one network cabinet. However, most passive cooling systems are designed for a single cabinet. Therefore, passive cooling systems are designed to accommodate a maximum heat load in each cabinet, rather than an average heat load across the entire data center, resulting in wasted resources.

Therefore, there is a need for a passive cooling system that is modular and can be easily installed in existing network cabinets. There is also a need for a passive cooling system that can be easily shared by more than one network cabinet.

BRIEF DESCRIPTION OF THE DRAWINGS

FIG. 9 is a top view of the passive cooling system of FIG. 1 showing the airflow pattern through two network cabinets connected in a side-by-side arrangement when the side panels of the cabinet extension are removed therefrom.

DETAILED DESCRIPTION OF THE INVENTION

FIGS. 1-9 illustrate a passive cooling system 100 for a network cabinet 10, such as the PANDUIT® NET-ACCESS™ Cabinets, according to several embodiments of the present invention.

Figure 1:
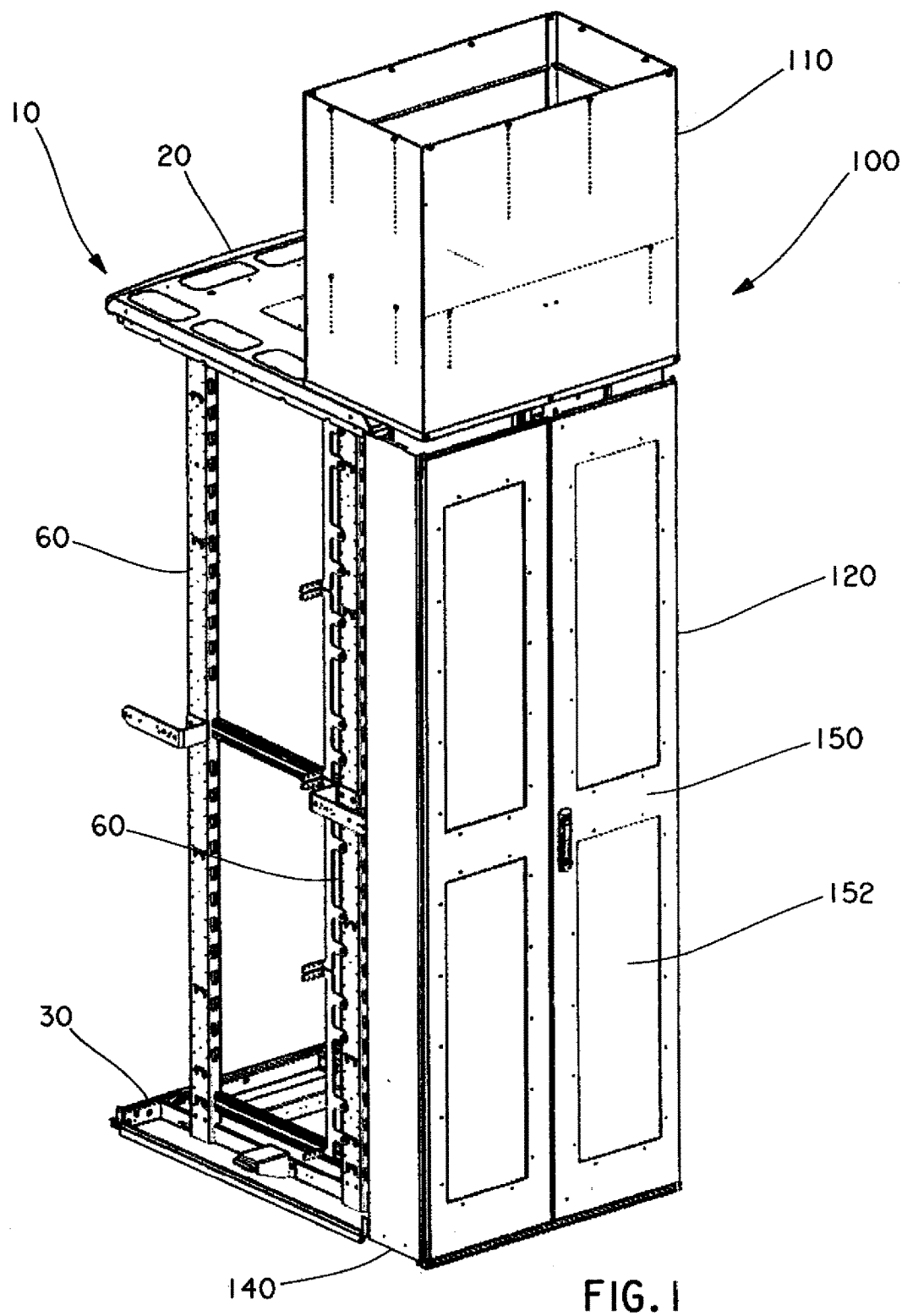
FIG. 1 is a perspective view of a passive cooling system for a network cabinet according to an embodiment of the present invention.

As best seen in FIG. 1, the passive cooling system 100 includes a chimney 110 and a cabinet extension 120. The chimney 110 is positioned above the cabinet extension 120, and overlaps a portion of the network cabinet 10.

Figure 2:
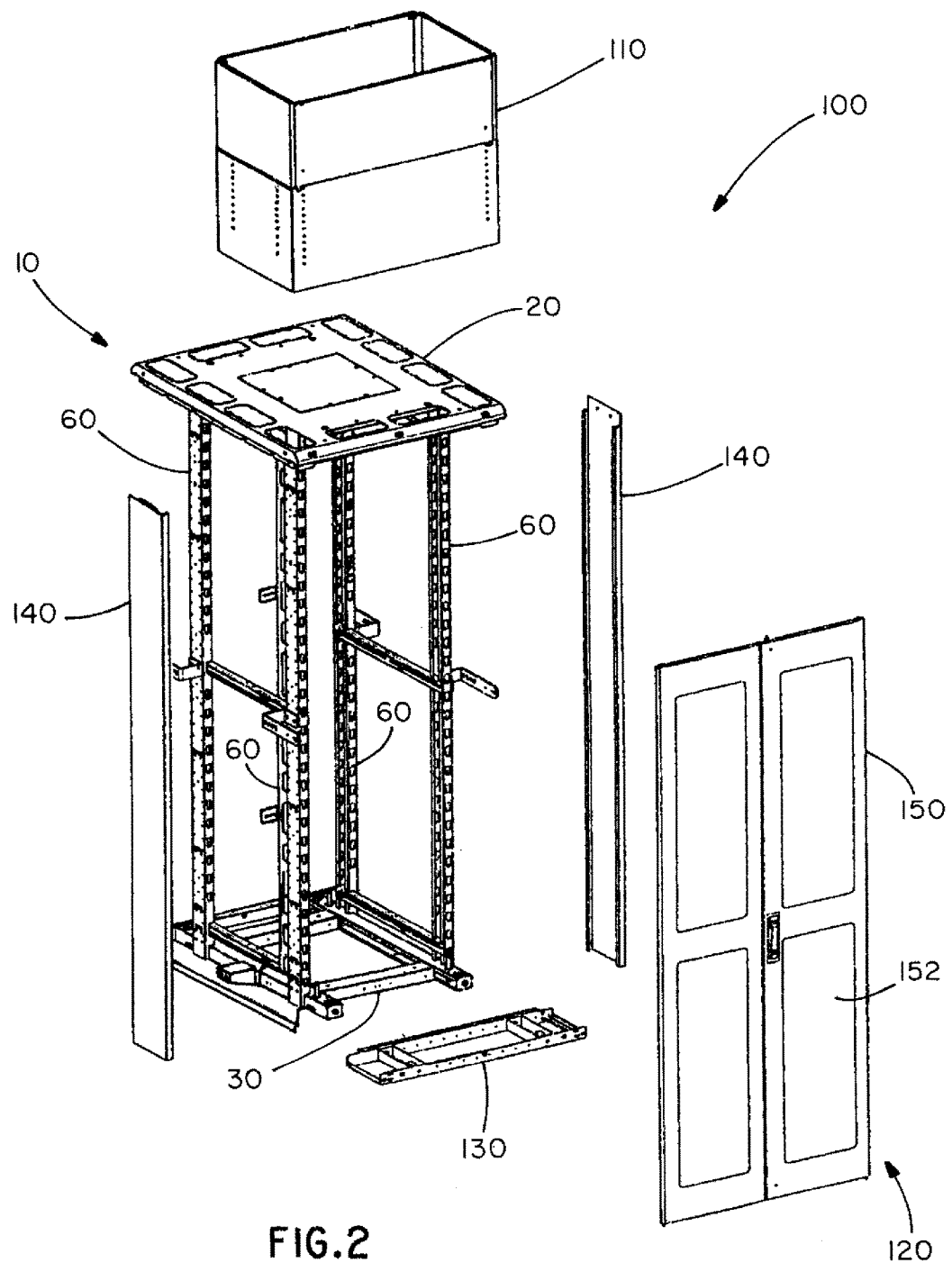
FIG. 2 is an exploded perspective view of the passive cooling system of FIG. 1.
Figure 7:
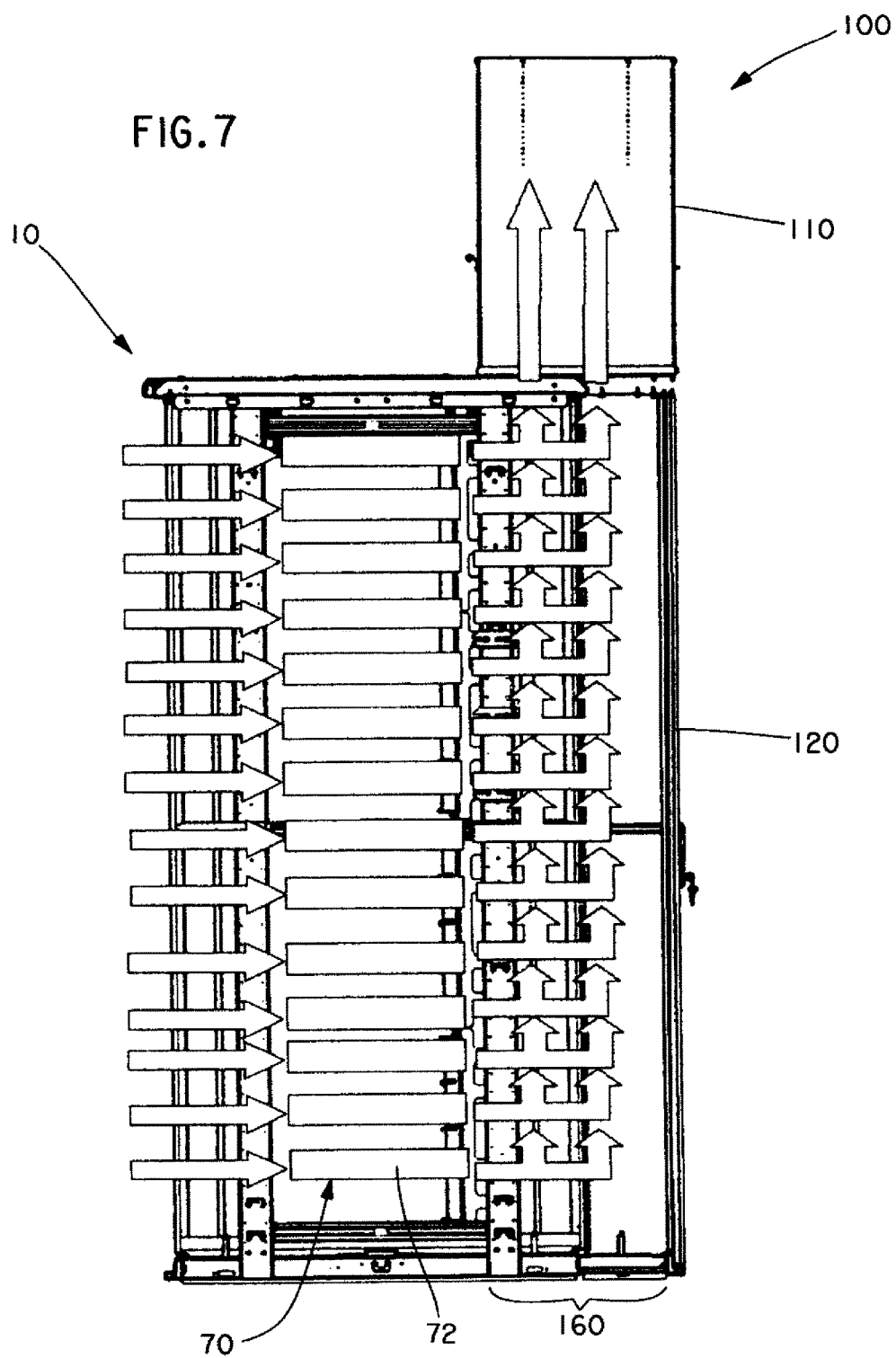
FIG. 7 is a side view of the passive cooling system of FIG. 1 showing the airflow pattern through the network cabinet.

As best seen in FIG. 2, the cabinet extension 120 includes a base or bottom extension piece 130, two side panels 140, and a back door 150. The cabinet extension 120 is positioned behind the network cabinet 10, and expands the volume of the network cabinet 10. The cabinet extension 120 and a portion of the network cabinet 10 that is adjacent to the cabinet extension 120 define an exhaust plenum 160 for the passive cooling system 100, as best seen in FIG. 7. Although the back door 150 is described with reference to the cabinet extension 120, it is understood that the back door 150 may be the back door 150 that was provided with the network cabinet 10. Moreover, the cabinet extension 120 is adapted to fit a variety of different network cabinets, for example, using optional mounting hardware (not shown), such as a top extension piece. In certain embodiments of the present invention, the base 130 includes a blocking panel (not shown). The blocking panel limits airflow through the bottom of the cabinet extension 120.

Figure 3:
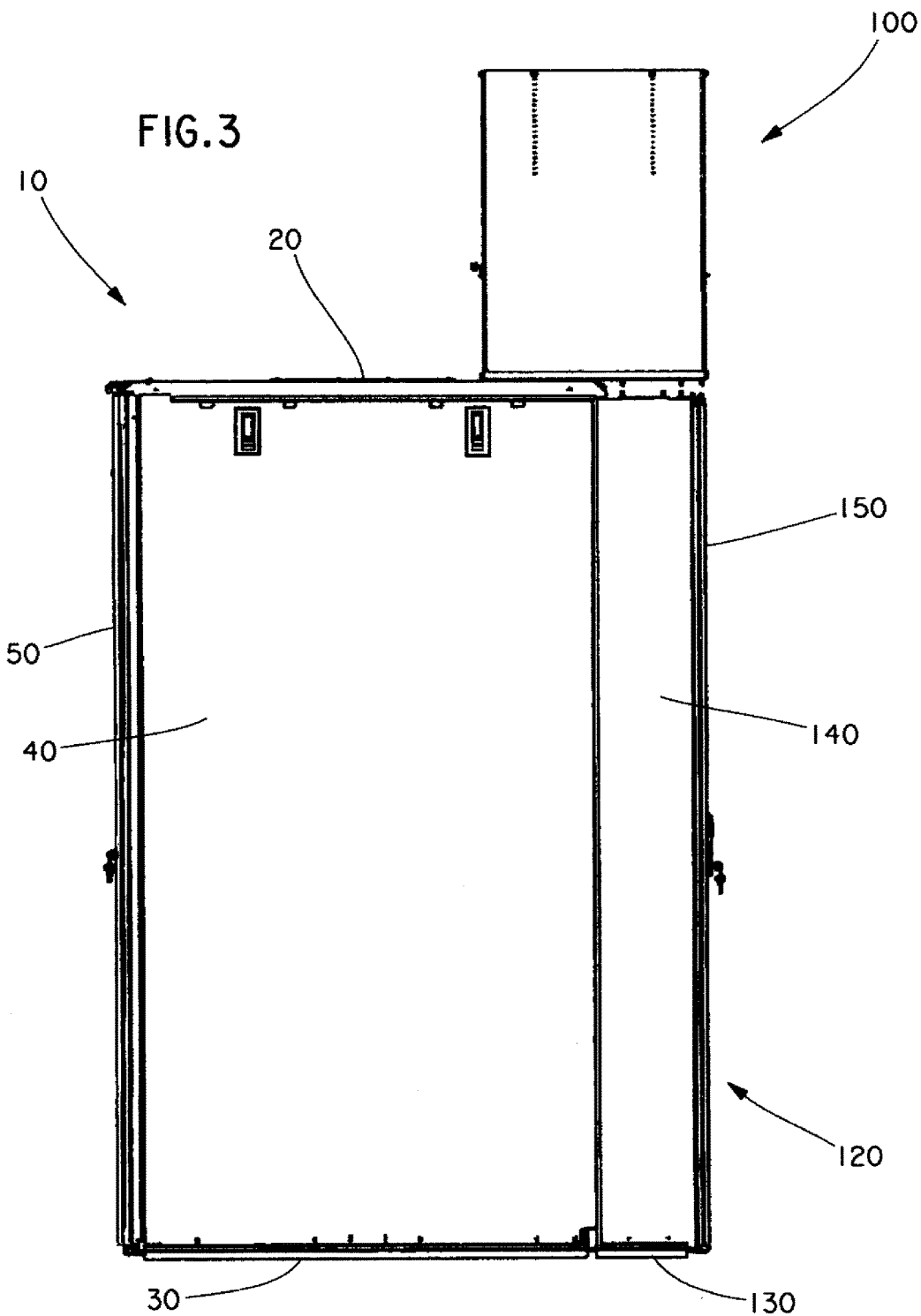
FIG. 3 is a side view of the passive cooling system of FIG. 1.

As best seen in FIG. 3, the network cabinet 10 includes a top panel 20, two side panels 40, and a front door 50, which have been removed from FIG. 1 and FIG. 2 for clarity. The network cabinet 10 also includes a base 30 and four side rails 60, two in the front of the network cabinet 10 and two in the back of the network cabinet 10, which provide structural support for the network cabinet 10 and its contents. In certain embodiments of the present invention, the base 30 includes a blocking panel (not shown). The blocking panel limits airflow through the bottom of the network cabinet 10.

In certain embodiments of the present invention, the front door 50 is perforated, which allows cold air from the surrounding environment to enter the network cabinet 10.

In certain embodiments of the present invention, the front door 50 and/or the back door 150 are split, which allows access to a smaller portion of the network cabinet 10 and reduces the amount of airflow to/from the network cabinet 10 when opened. Examples of split back doors 150 are provided in FIG. 4 and FIG. 5.

Figure 4:
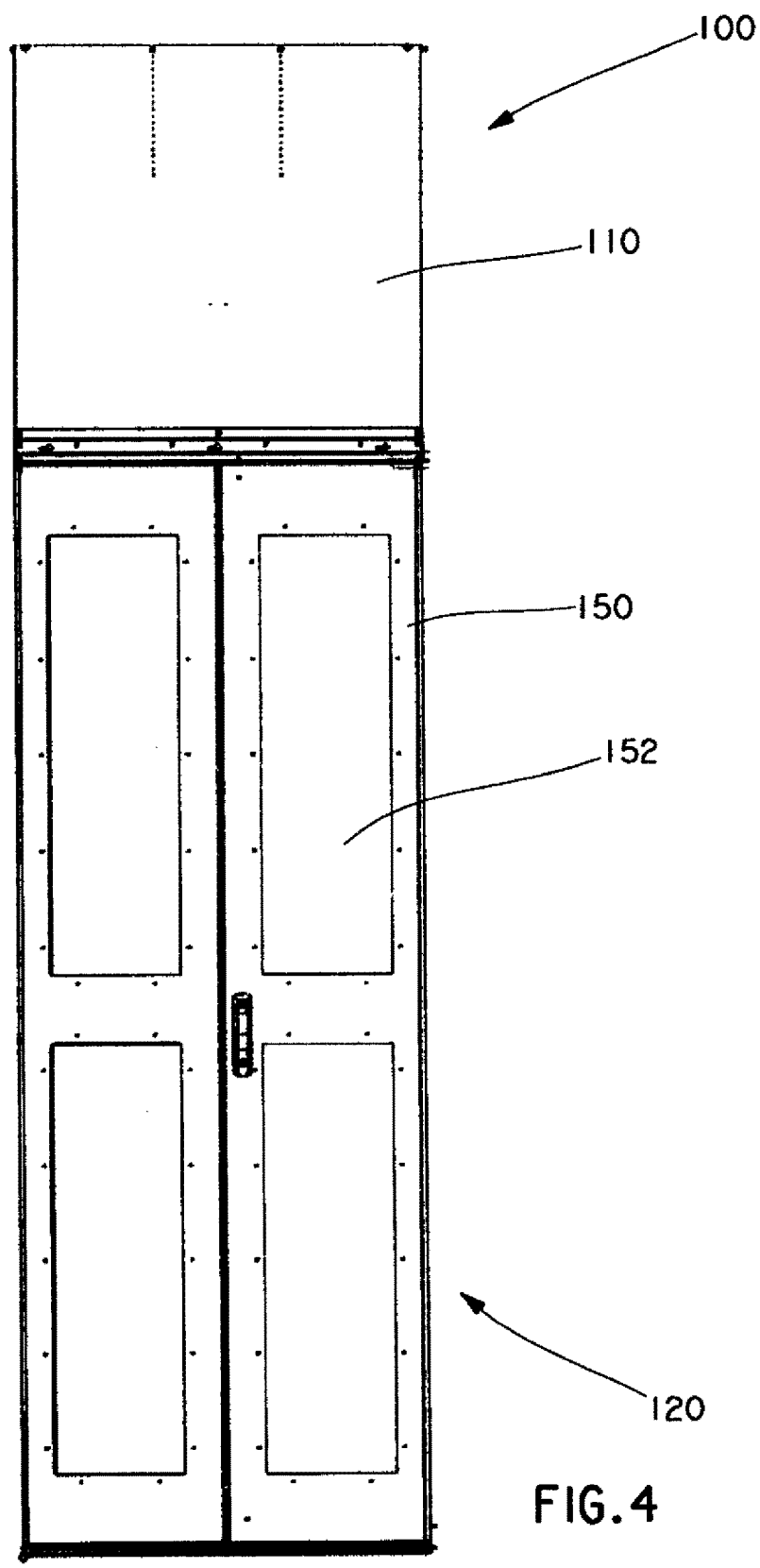
FIG. 4 is a back view of the passive cooling system of FIG. 1 having a split back door and transparent windows.
Figure 5:
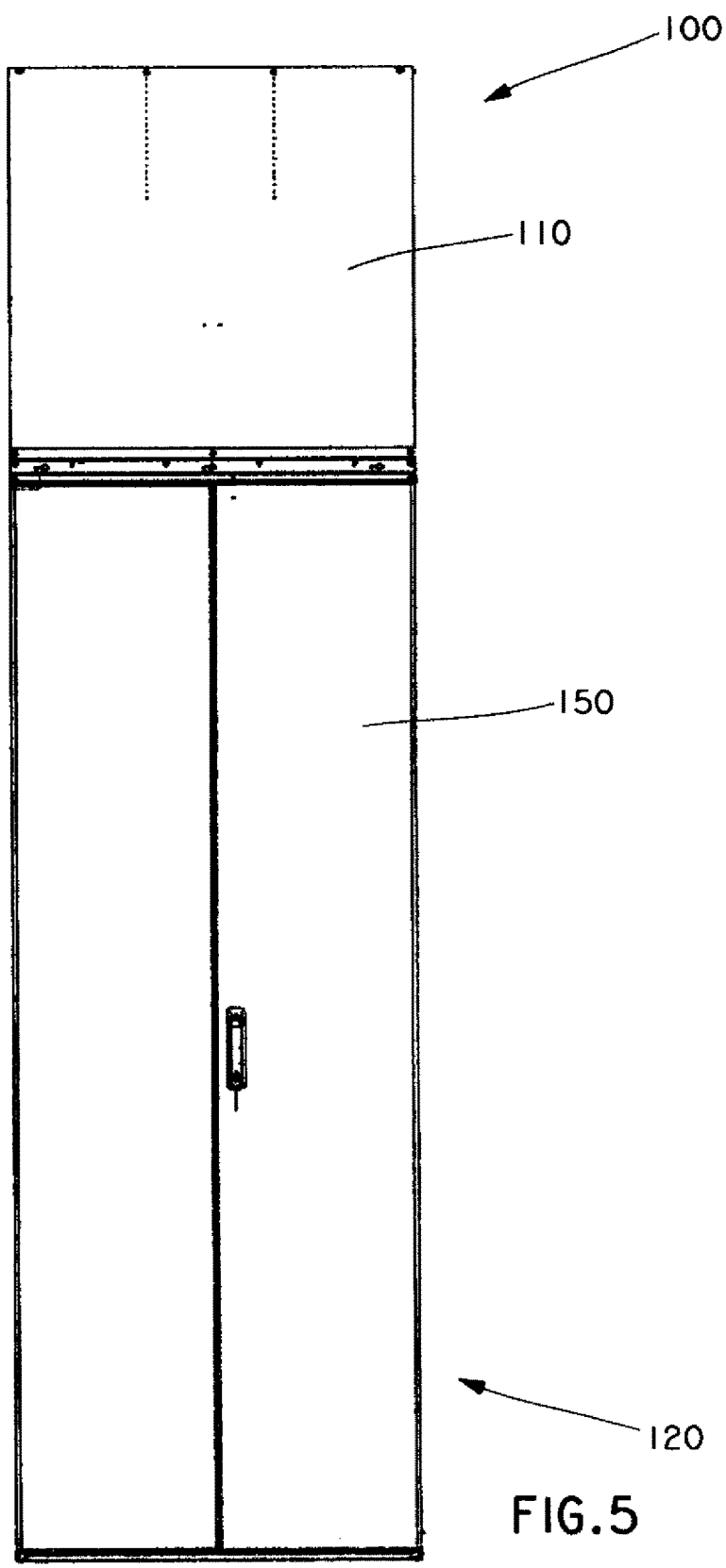
FIG. 5 is a back view of the passive cooling system of FIG. 1 having a split back door and no windows.

In certain embodiments of the present invention, the back door 150 of the network cabinet 10, or portions thereof, may be transparent and/or translucent, as shown in FIG. 4, or opaque, as shown in FIG. 5. For example, as shown in FIG. 4, the back door 150 includes a plurality of windows 152, which are preferably made of a transparent material, such as glass or plexiglass. Transparent doors are preferred because the interior of the network cabinet 10 is visible without opening the back door 150. Opening the back door 150 allows hot air to exit the network cabinet 10 into the surrounding environment. The hot air is then recirculated into the network cabinet 10 and/or adjacent network cabinets 10, thereby reducing the effectiveness of the passive cooling system 100.

Figure 6:
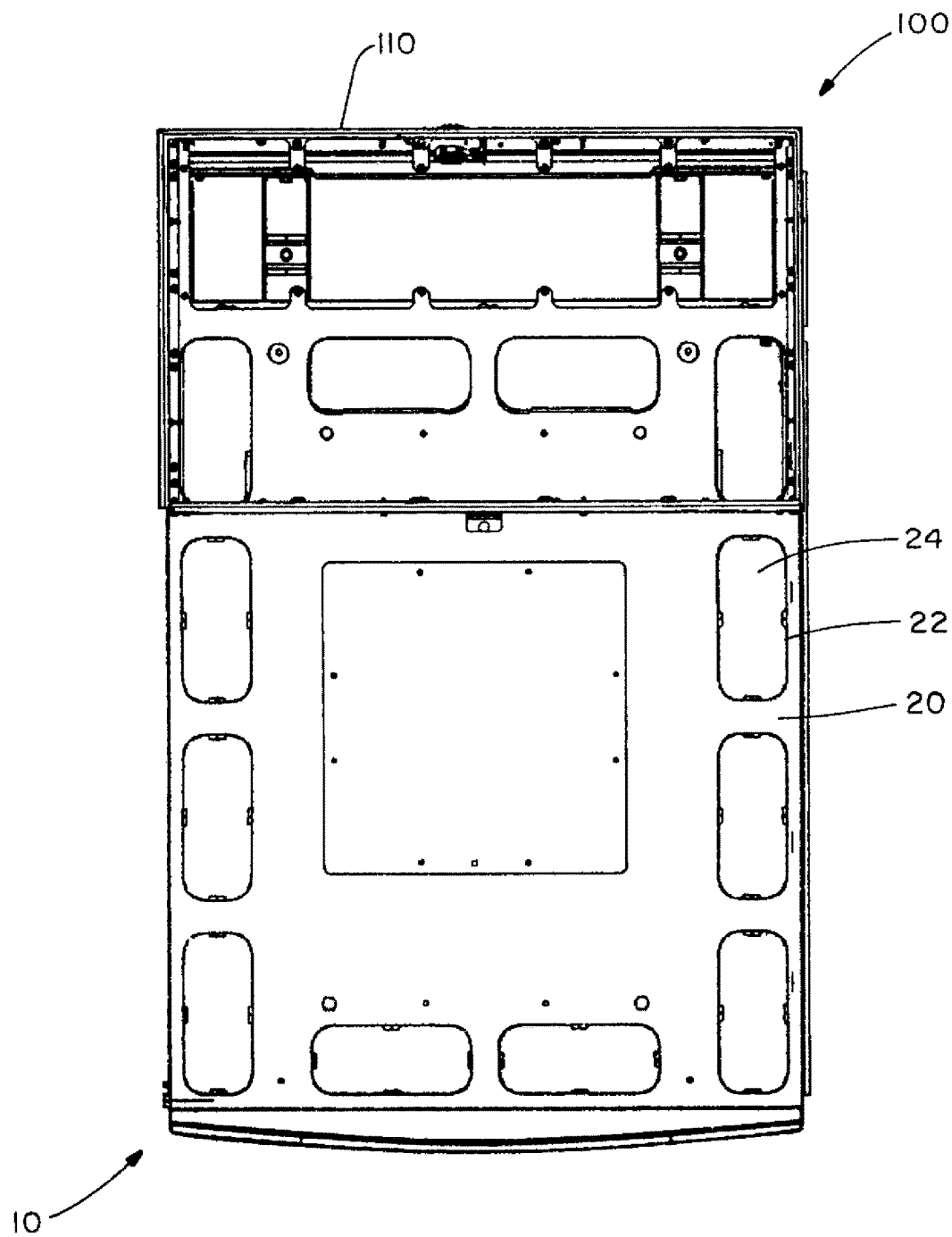
FIG. 6 is a top view of the passive cooling system of FIG. 1.

As best seen in FIG. 6, the top panel 20 of the network cabinet 10 includes a plurality of openings 22. Each of the openings 22 includes a knockout 24. One or more of the knockouts 24 may be removed to accommodate additional airflow to the chimney 110. For example, as shown in FIG. 6, one of the four side knockouts 22 and all of the rear knockouts 24 are removed.

As described above, the chimney 110 is positioned above the cabinet extension 120 and overlaps a portion of the top panel 20. The cabinet extension 120 extends beyond the two side rails 60 in the back of the network cabinet 10, expanding the volume of the network cabinet 10, and more particularly, the exhaust plenum 160. A larger exhaust plenum 160 increases the capacity of the passive cooling system 100, as compared to simply installing a chimney on an existing network cabinet.

As best seen in FIG. 7, the network cabinet 10 stores and secures network components 70, such as servers 72 (FIG. 7) and/or switches 74 (FIGS. 10A-D), which generate heat. Cold air enters the network cabinet 10 through the perforated front doors 50. Heat from the network components 70 is transferred to the cold air, transforming it into hot air, which flows into the exhaust plenum 160 and exits the network cabinet 10 through the chimney 110.

Figure 8:
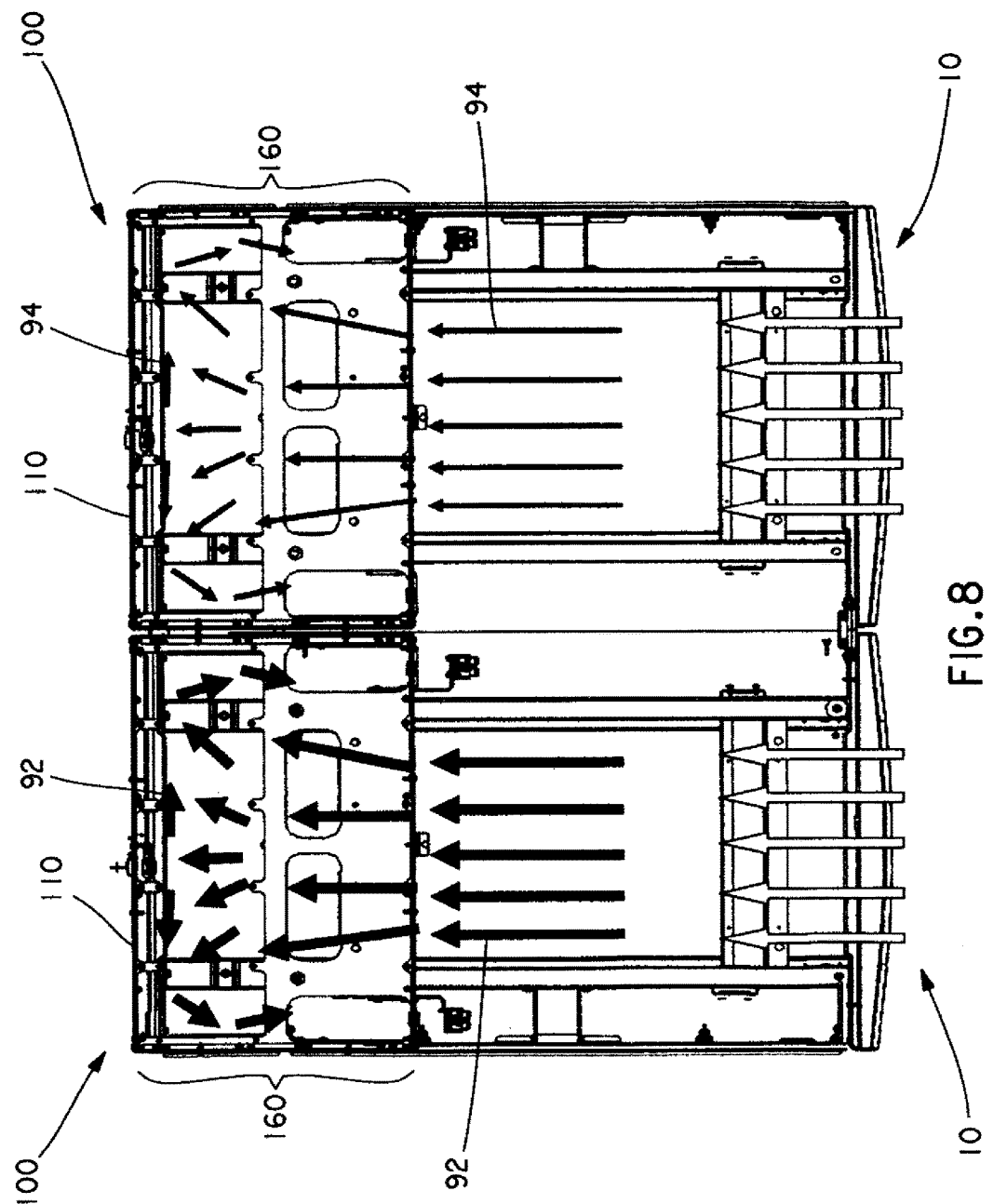
FIG. 8 is a top view of the passive cooling system of FIG. 1 showing the airflow pattern through two network cabinets connected in a side-by-side arrangement.

In certain embodiments of the present invention, two or more network cabinets 10 may be connected in a side-by-side arrangement, for example, in one or more rows and one or more columns, which is typical in a data center. The side panels 140 between adjacent network cabinets 10 may remain in place or be removed. For example, as shown in FIG. 8, the side panels 140 between adjacent network cabinets 10 remain in place, allowing the passive cooling systems 100 to act independently. That is, each passive cooling system 100 is responsible for cooling one, and only one, network cabinet 10, and does not assist in cooling adjacent network cabinets 10. Conversely, as shown in FIG. 9, the side panels 140 are removed, resulting in a shared exhaust plenum 160.

As shown in FIG. 8 and FIG. 9, the network cabinet 10 on the left is generating a relatively high amount of heat, as represented by large arrows 92, and the network cabinet 10 on the right is generating a relatively low amount of heat, as represented by small arrows 94. Comparing FIG. 8 and FIG. 9, the shared exhaust plenum 160 balances the heat generated by both network cabinets 10, and evenly distributes it to each chimney 110, as represented by medium arrows 96. Therefore, the shared exhaust plenum 160 allows the network cabinets 10 to share passive cooling systems 100, which is preferred because network cabinets 10 are dynamic, generating different amounts of heat at different times of day.

Figure 10A:
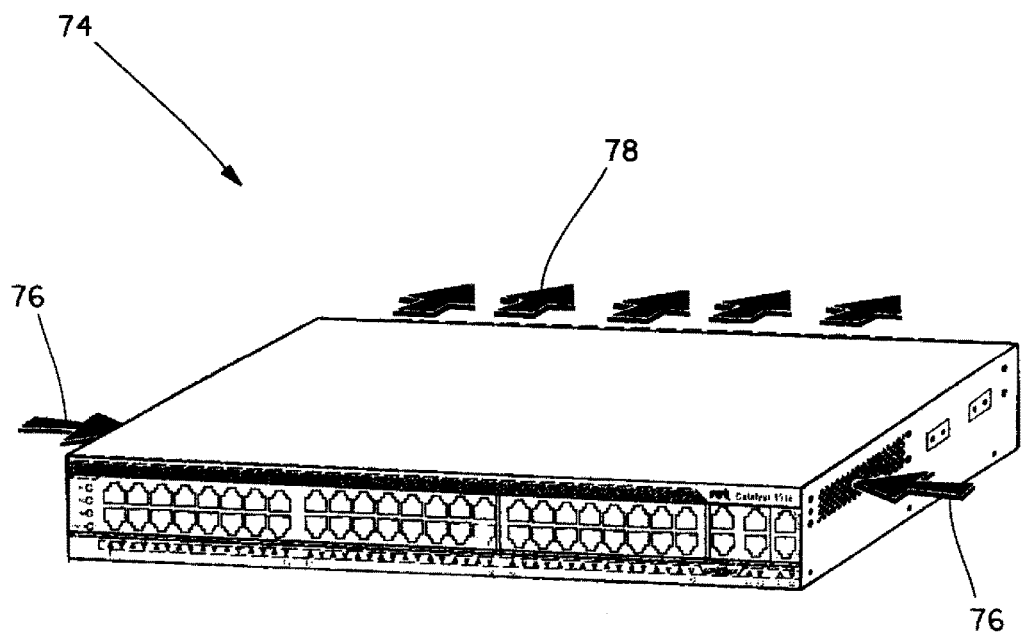
FIG. 10A is a perspective view of a switch for the network cabinet of FIG. 1.

As described above, the network cabinets 10 store and secure the network components 70, such as servers 72 (FIG. 7) and/or switches 74 (FIGS. 10A-D). Servers 72 are typically vented from front-to-back. That is, cold air enters through an inlet vent on the front of the server 72, and hot air exits through an outlet vent on the back of the server 72, as shown in FIG. 7. Switches 74, on the other hand, are typically vented from side-to-back. That is, cold air enters through an inlet vent 76 on the side of the switch 74, and hot air exits through an outlet vent 78 on the back of the switch 74, as shown in FIG. 10A.

Switches 74 are typically installed at the top of the network cabinet 10, with the back of the switch 74 facing the front of the network cabinet 10. In such a configuration, hot air from the network cabinet 10 and the passive cooling system 100 enters through the inlet vents 76 on the sides of the switch 74, and even hotter air exits through the outlet vents 78 on the back of the switch 74, potentially contaminating the cold air supply at the front of the cabinet.

Figure 10B:
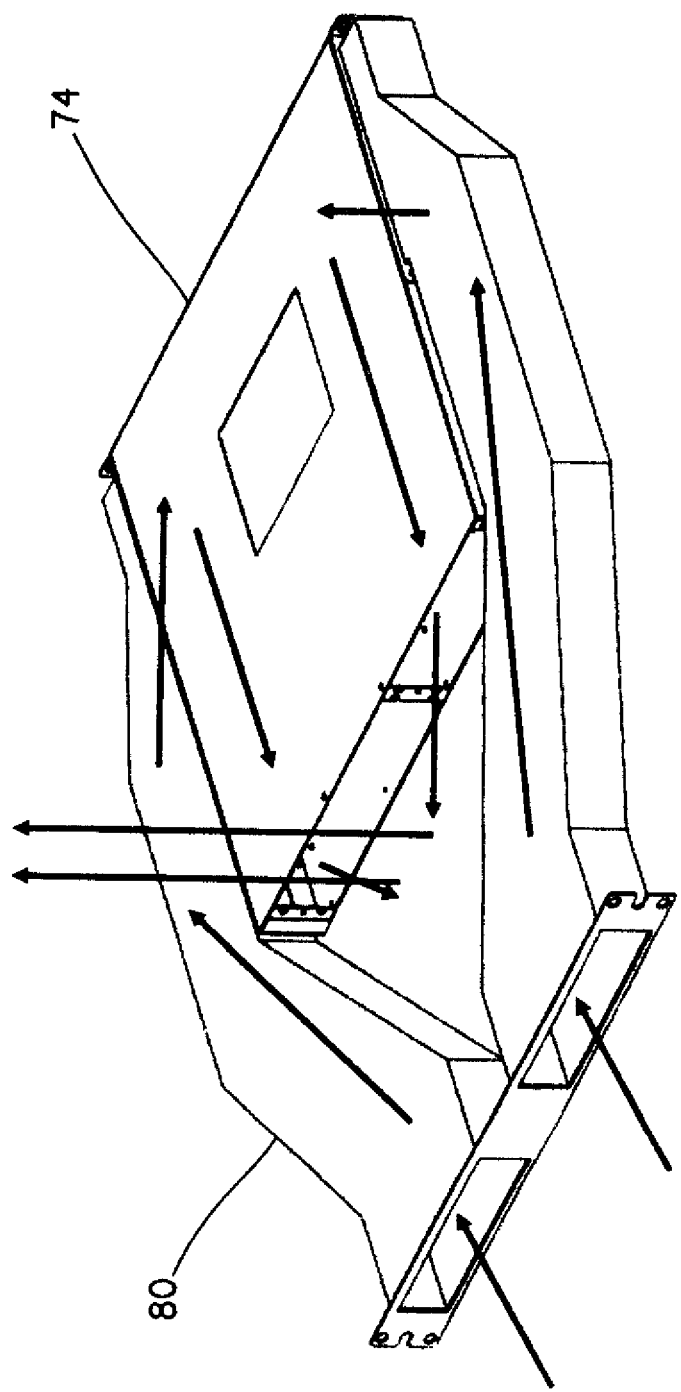
FIG. 10B is a perspective view of a duct for the switch of FIG. 10A according to an embodiment of the present invention.
Figure 10C:
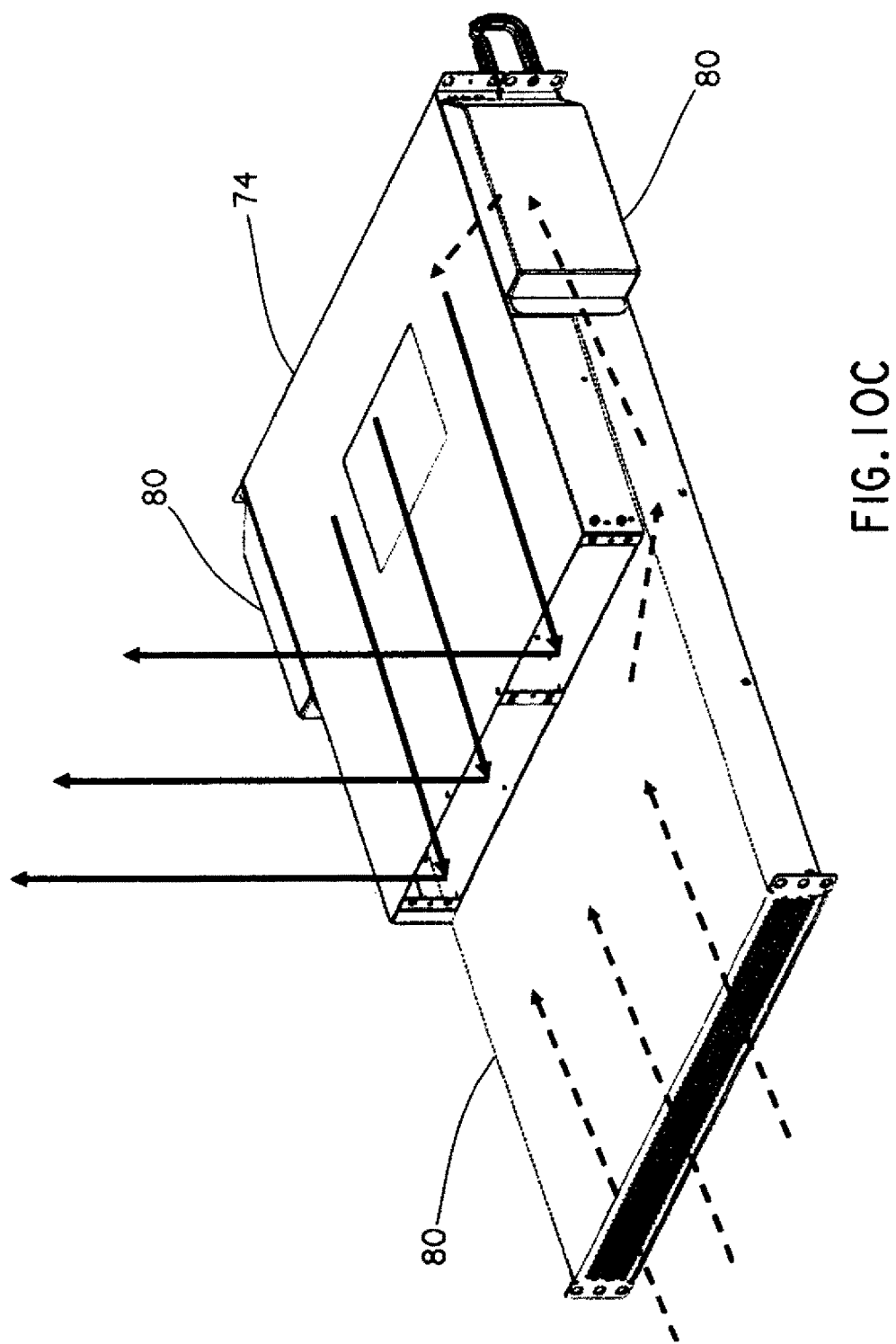
FIG. 10C is a perspective view of a duct for the switch of FIG. 10A according to an alternative embodiment of the present invention.

One solution to this problem is to reroute the airflow through the switch 74 using a duct 80. Examples of ducts 80 and their corresponding airflow patterns are provided in FIG. 10B and FIG. 10C. As shown in FIG. 10B and FIG. 10C, cold air enters through the front of the duct 80, which reroutes the cold air through the inlet vents 76 on the side of the switch 74. Hot air exits through the outlet vent 78 on the back of the switch 74. The duct 80 prevents the hot air, or at least a portion of it, from flowing below the switch 74 and into the network cabinet 10, thereby rerouting the hot air into the exhaust plenum 160 and out the chimney 110 of the passive cooling system 100.

Figure 10D:
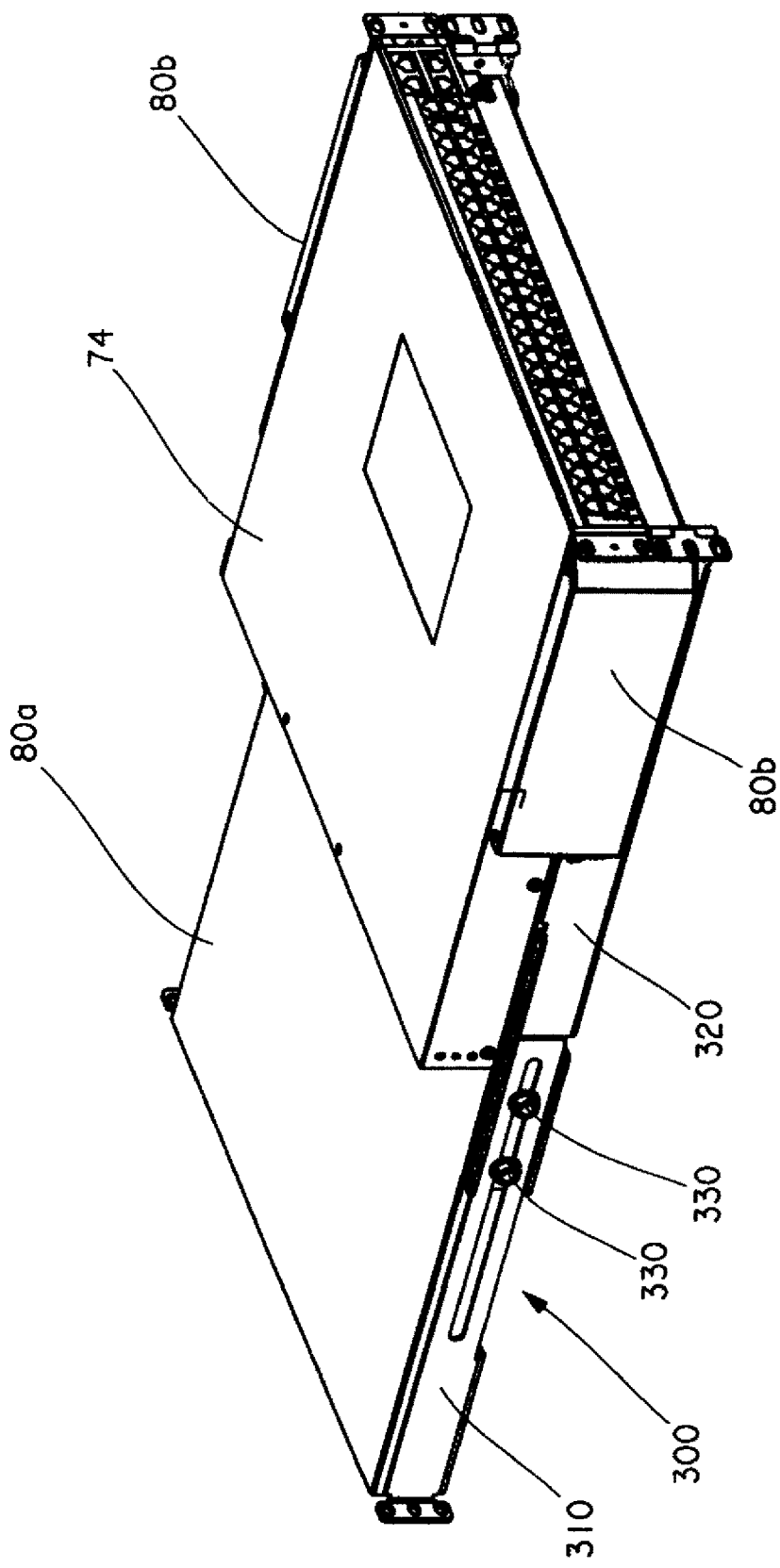
FIG. 10D is a perspective view of an adjustable rail assembly for the cooling duct assembly of FIG. 10C.

As best seen in FIG. 10D, the cooling duct assembly 80 includes a main duct 80a and two side ducts 80b. Preferably, the main duct 80a is disposed below the switch 74 to block hot air from the front air exhaust openings 78, but it is likewise contemplated that the main duct 80a is disposed above the switch 74. The side ducts 80b are disposed on opposite sides of the switch 74 and associated with the side air intake openings 76.

The cooling duct assembly 80 is mounted to the cabinet 10 (not shown) via an adjustable rail assembly 300. As best seen in FIG. 10D, the adjustable rail assembly 300 includes a first rail 310, a second rail 320, and a plurality of fasteners 330. The first rail 310 and the second rail 320 are slidably connected, allowing the length of the adjustable rail assembly 300 in position. Tightening the fasteners 330 locks the adjustable rail assembly 300 at a desired length L.

Figure 10E:
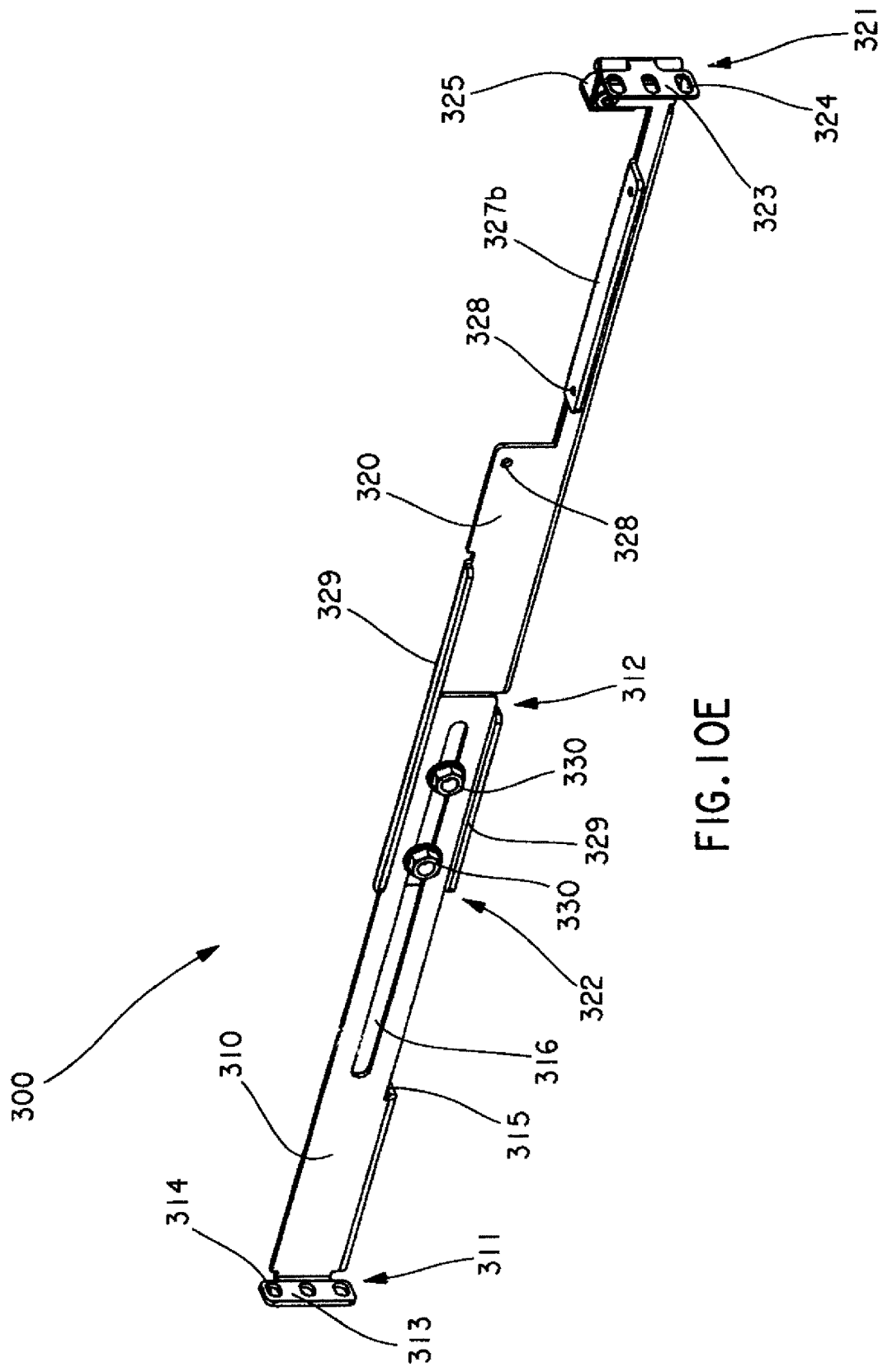
FIG. 10E is a perspective view of the adjustable rail assembly of FIG. 10D, showing the outside of the adjustable rail assembly.

As best seen in FIG. 10E, the first rail 310 includes a first end 311 and a second end 312 opposite the first end 311. The first end 311 of the rail 310 includes a flange 313 for mounting the adjustable rail assembly 300 to the cabinet 10. For example, the flange 313 includes a plurality of holes 314 for fastening the rail 310 to the cabinet 10. Additionally, the first end 311 of the rail 310 includes an edge 315 for supporting the cooling duct assembly 80, and more particularly, the main duct 80a (see FIG. 10D). The second end 312 of the rail 310 includes a slot 316.

Figure 10F:
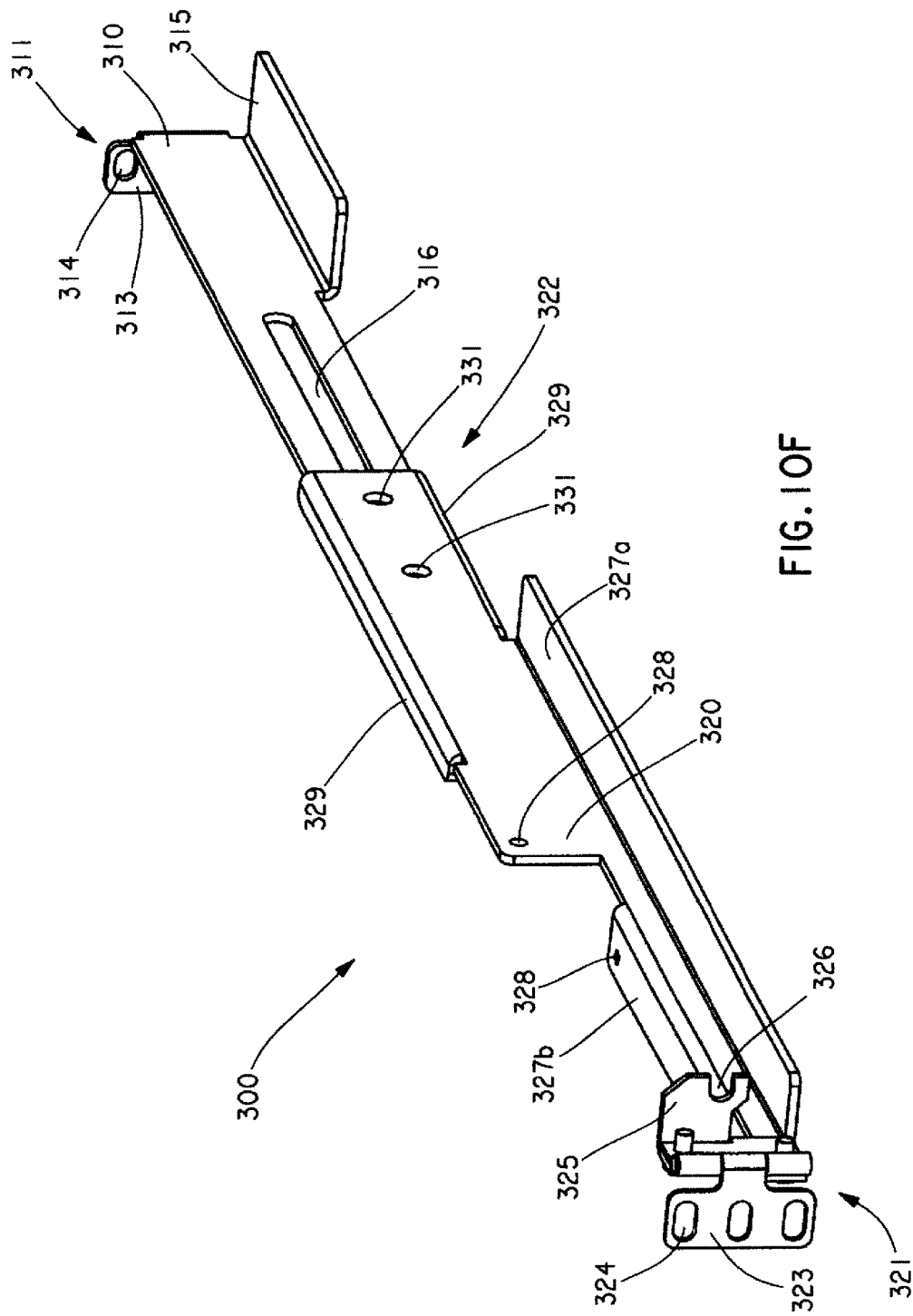
FIG. 10F is a perspective view of the adjustable rail assembly of FIG. 10D, showing the inside of the adjustable rail assembly.

As best seen in FIG. 10F, the second rail 320 includes a first end 321 and a second end 322 opposite the first end 321. The first end 321 of the rail 320 includes a flange 323 for mounting the rail 320 to the cabinet 10. For example, the flange 323 includes a plurality of holes 324 for fastening the rail 320 to the cabinet 10. In certain embodiments of the present invention, the flange 323 is rotatably connected to the rail 320. Additionally, the first end 321 of the rail 320 includes a flange 325 for mounting the cooling duct assembly 80, and more particularly, the main duct 80b, to the adjustable rail assembly 300. For example, the flange 325 includes an opening 326 for fastening the main duct 80b to the adjustable rail assembly 300. Additionally, the first end 321 of the rail 320 includes a plurality of edges for supporting the cooling duct assembly 80. For example, a first edge 327a supports the main duct 80a and a second edge 327b supports the side duct 80b (see FIG. 10D). The rail 320 includes a plurality of holes 328 for fastening the side ducts 80b to the adjustable rail assembly 300. The second end 322 of the rail 320 includes a plurality of rollover edges 329 for receiving the second end 312 of the first rail 310. Additionally, the second end 322 of the rail 320 includes a plurality of holes 331 for receiving the fasteners 330.

Most network components 20 are configured for front to back cooling, and therefore, most network cabinets 10, which store the network components 20, are similarly configured. That is, cold air, for example, from a cold aisle in a data center and/or under the floor, enters the front of the cabinet 10, and hot air, for example, exhausted from one or more network components, exits the back of the cabinet 10. Preferably, the hot air exits through a chimney, such as the chimney 110 of the passive cooling system 100 (FIGS. 1-9), but it is likewise contemplated that the hot air exits the cabinet 10, for example, through one or more openings in the back of the cabinet 10 and into a hot aisle and/or above the ceiling in the data center.

Figure 11:
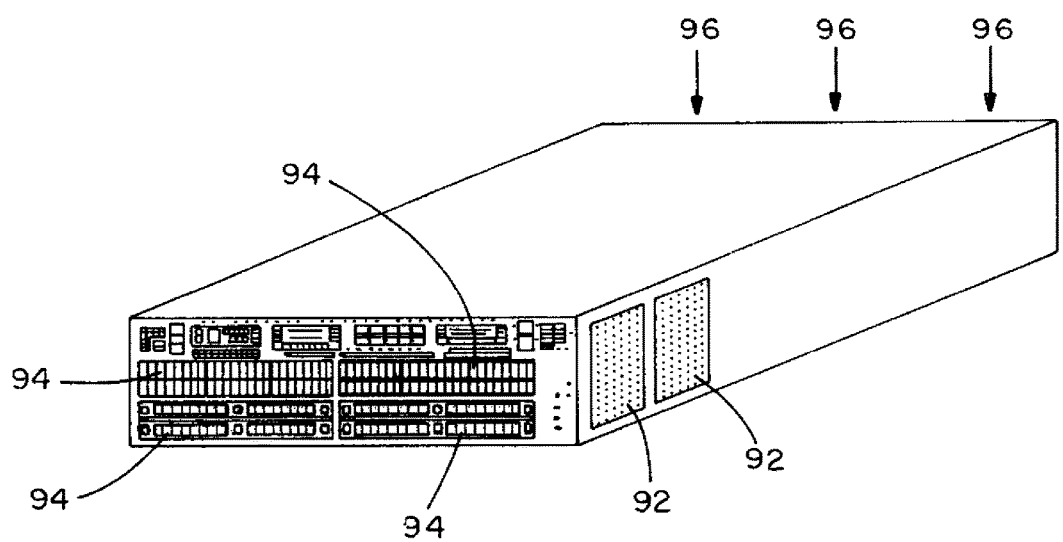
FIG. 11 is a top back perspective view of a router, such as a Cisco 3845 Integrated Services Router.

Additionally or in the alternative, some network components 70 may be configured for side to front and/or back to front cooling. For example, as best seen in FIG. 11, a router 90, such as a Cisco 3845 Integrated Services Router, is configured for side to front and back to front cooling. That is, cold air enters the sides of the router 90 via one or more side air intake openings 92. Additionally, the cold air enters the back of the router 90 via one or more back air intake openings 94. Hot air exits the front of the router 90 via one or more front air exhaust openings 96. When the router 90 is installed in the cabinet 10, hot air in the back of the cabinet 10 enters the side air intake ports 92 and the back air intake ports 94, and even hotter air exits the front air exhaust openings 96, potentially contaminating the cold air in the front of the cabinet 10.

Figure 27:
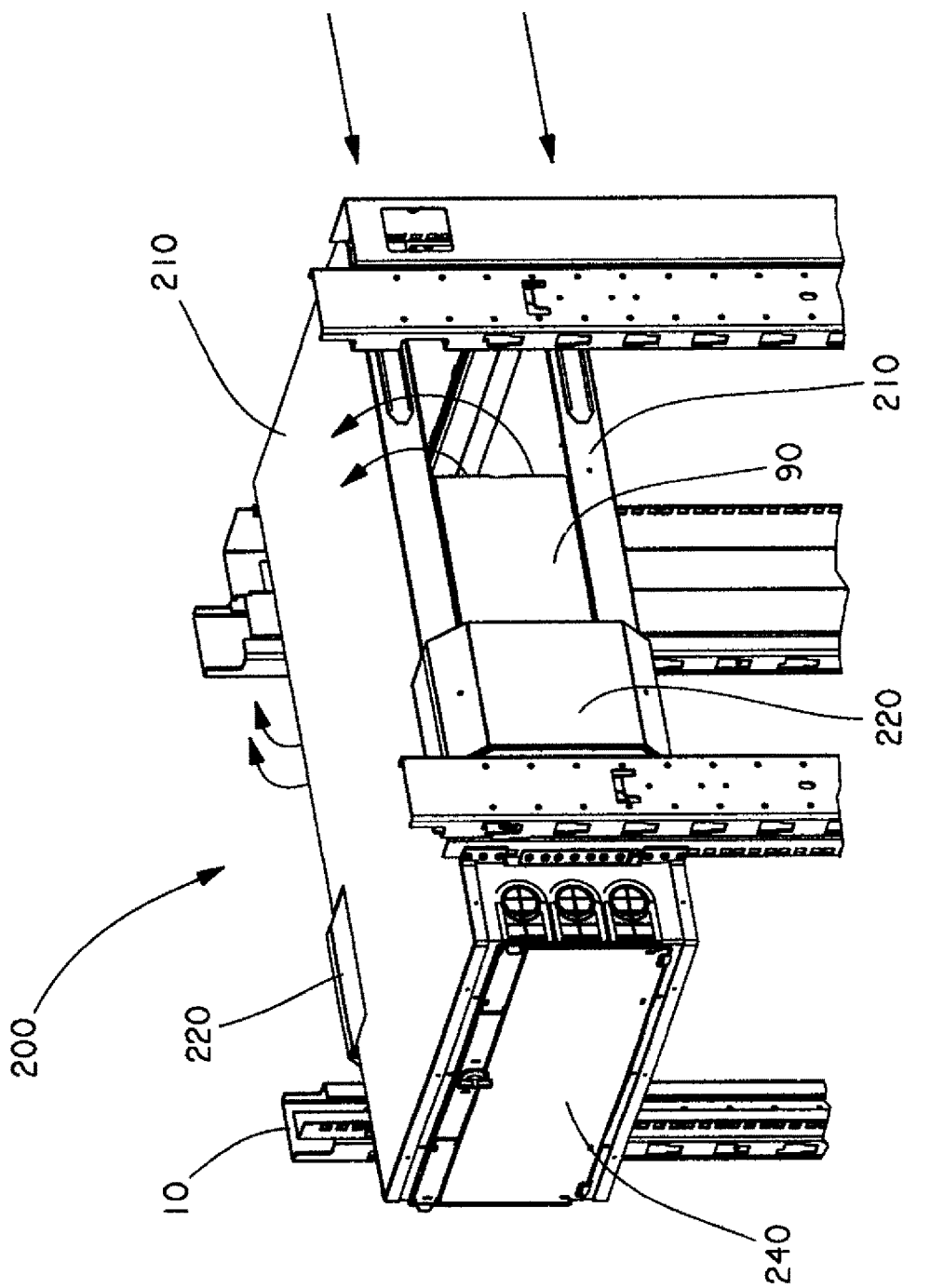
FIG. 27 is a top back perspective view of the cooling duct assembly of FIG. 12, showing the airflow pattern through the cooling duct assembly and out of the router.
Figure 28:
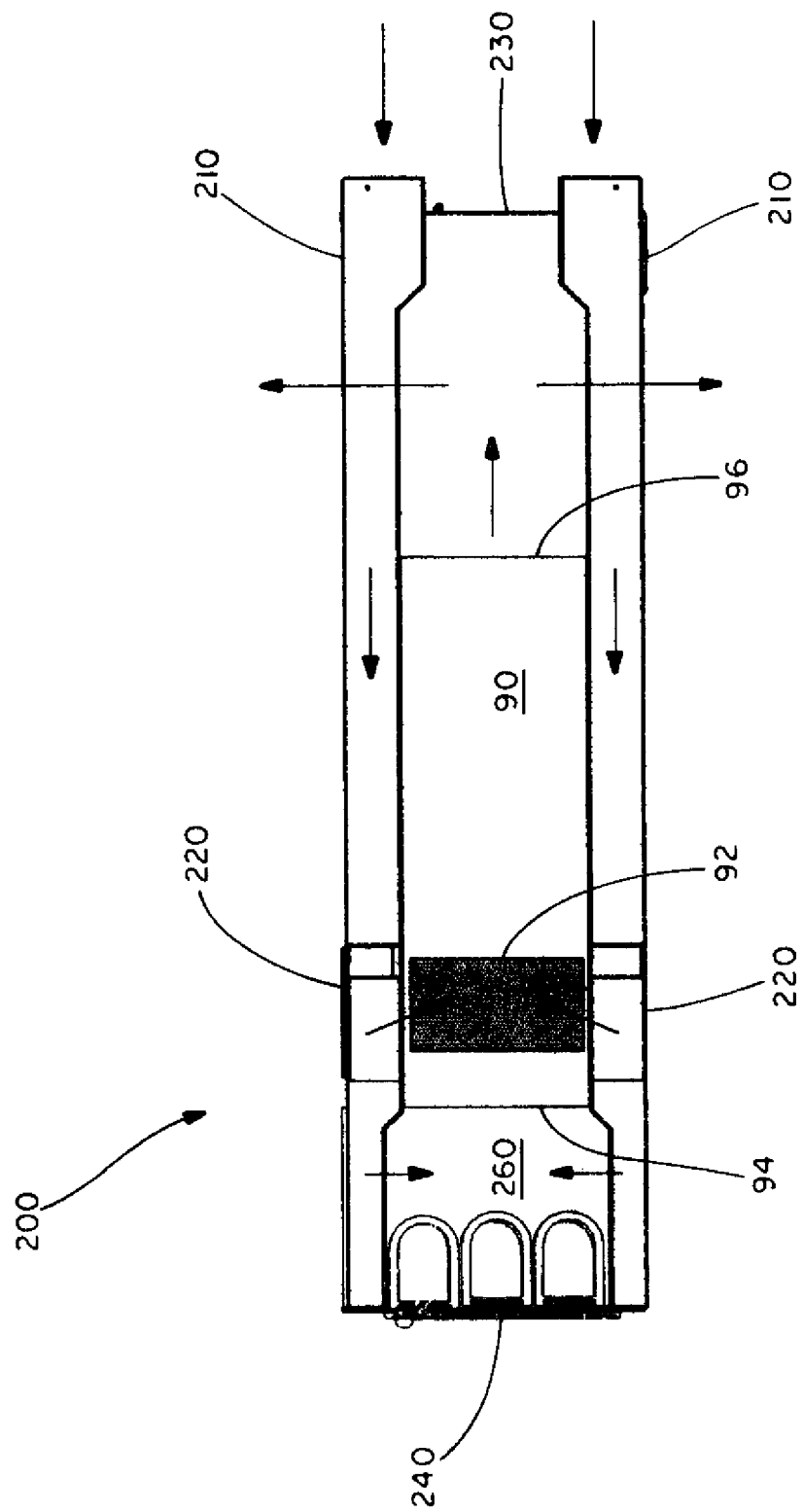
FIG. 28 is a side view of the cooling duct assembly of FIG. 27, further showing the airflow pattern through the cooling duct assembly and out of the router.

One solution to this problem is to change the airflow pattern of the router 90 to more closely match the airflow pattern of cabinet 10. For example, as best seen in FIG. 27 and FIG. 28, a cooling duct assembly 200 reroutes cold air from the front of the cabinet 10 to the sides and back of the router 90, and hot air from the front of the router 90 to the sides and back of the cabinet 10.

Figure 12:
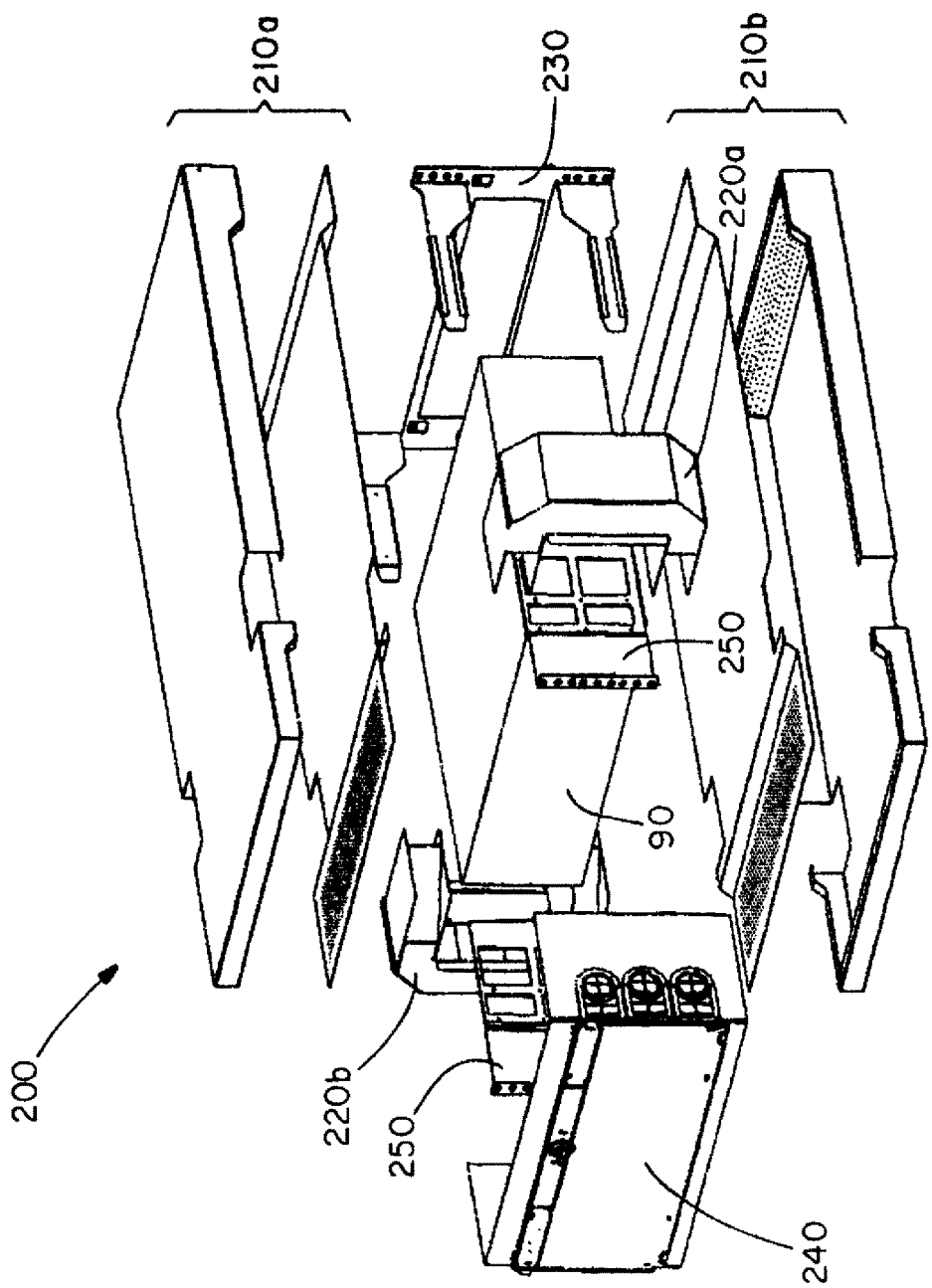
FIG. 12 is an exploded top back perspective view of a cooling duct assembly for the router of FIG. 11.

As best seen in FIG. 12, the cooling duct assembly 200 includes a pair of main ducts 210, such as top duct 210a and bottom duct 210b, a pair of side ducts 220, such as left side duct 220a and right side duct 220b, a front access door assembly 230, a back access door assembly 240, and two side brackets 250.

Figure 13:
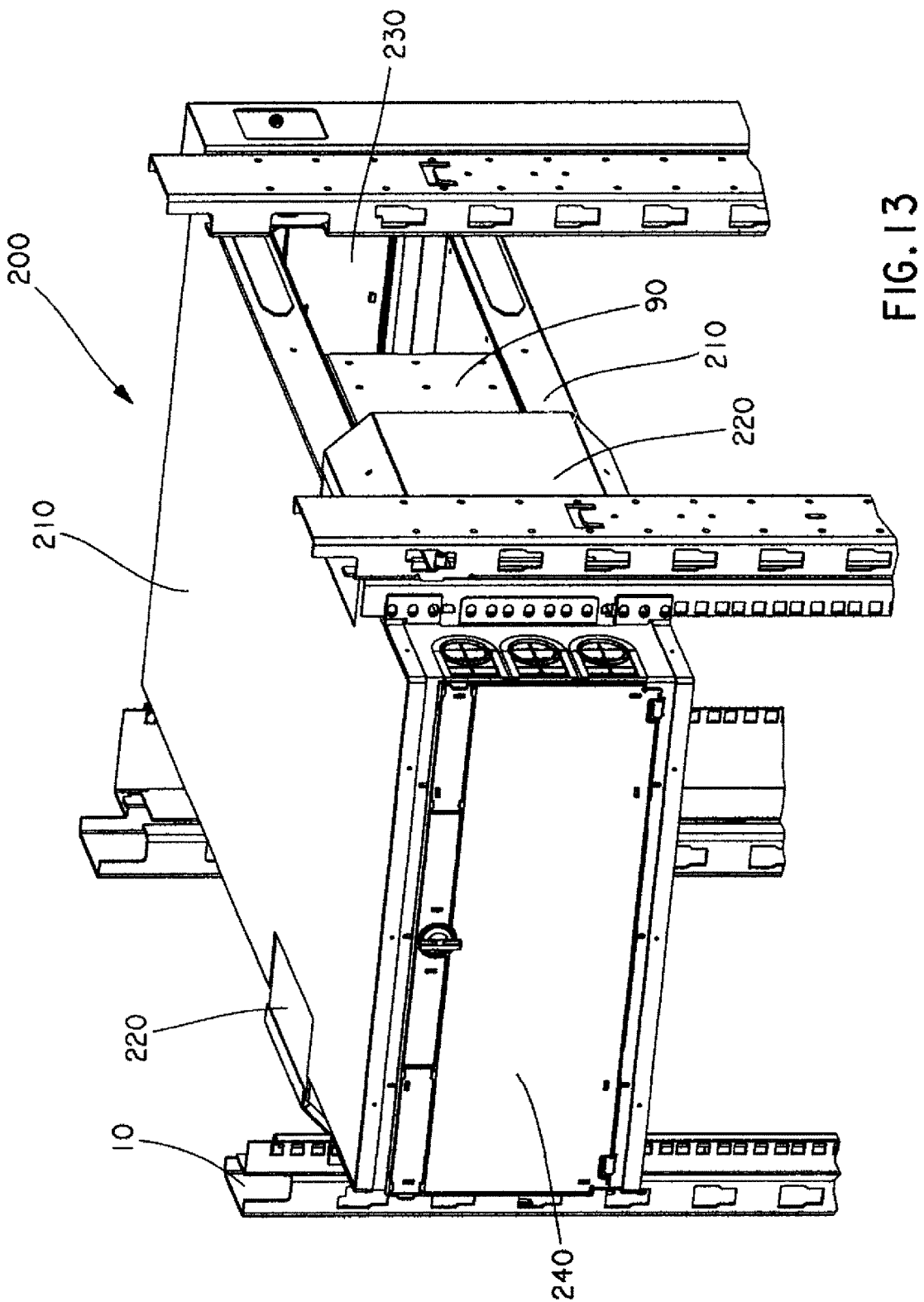
FIG. 13 is a top back perspective view of the cooling duct assembly of FIG. 12, showing the cooling duct assembly installed in a network cabinet.
Figure 14:
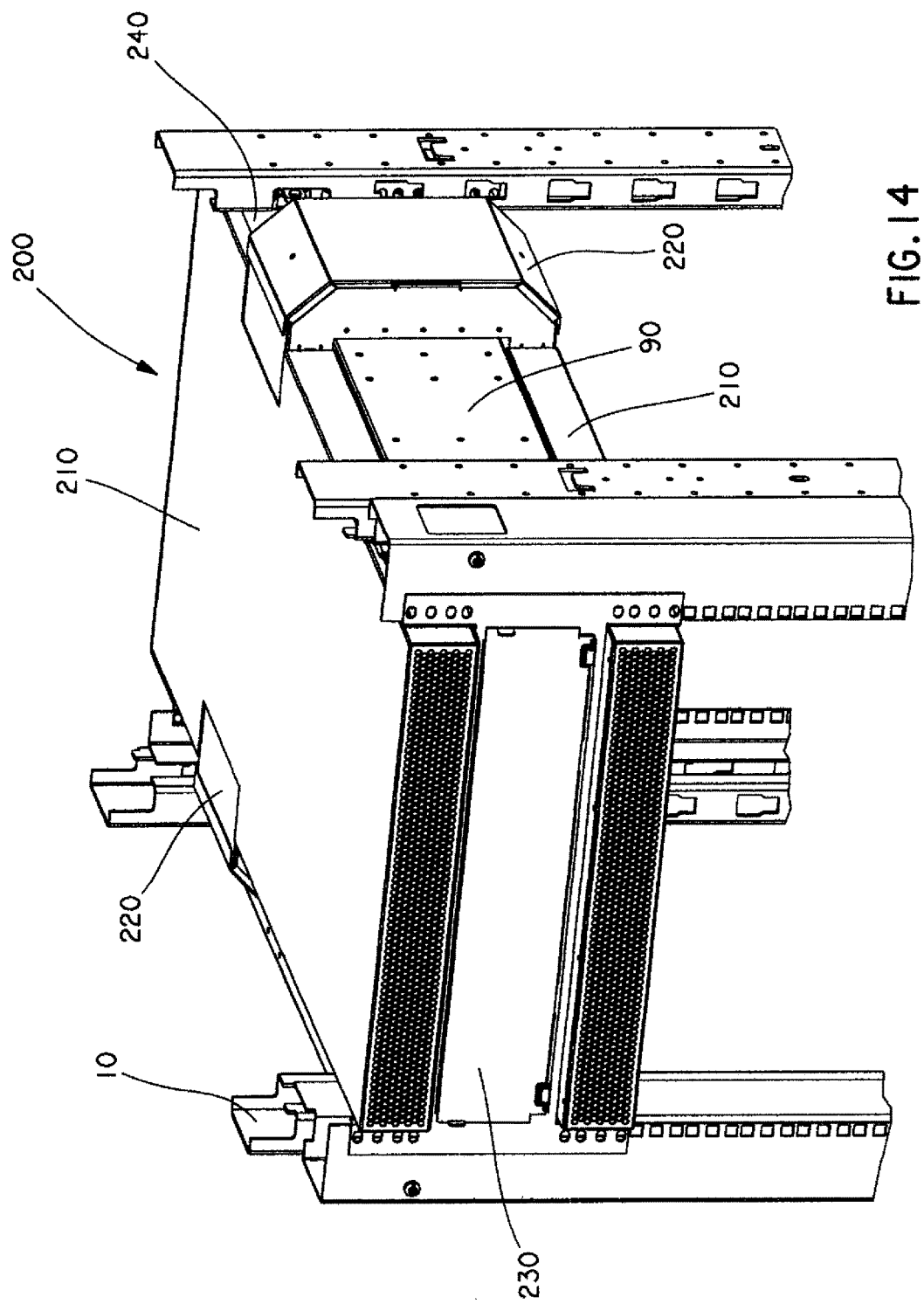
FIG. 14 is a top front perspective view of the cooling duct assembly of FIG. 12, showing the cooling duct assembly installed in a network cabinet.

As best seen in FIG. 13 and FIG. 14, the main ducts 210 are disposed on the top and the bottom of the router 90. That is, the top duct 210a is disposed on the top of the router 90 and the bottom duct 220b is disposed on the bottom of the router 90. As best seen in FIG. 28, the main ducts 210 extend from the front of the router 90 and beyond the back of the router 90 to define a back air plenum 260 therebetween. The back air plenum 260 is aligned with the back air intake openings 94 of the router 90.

Figure 15:
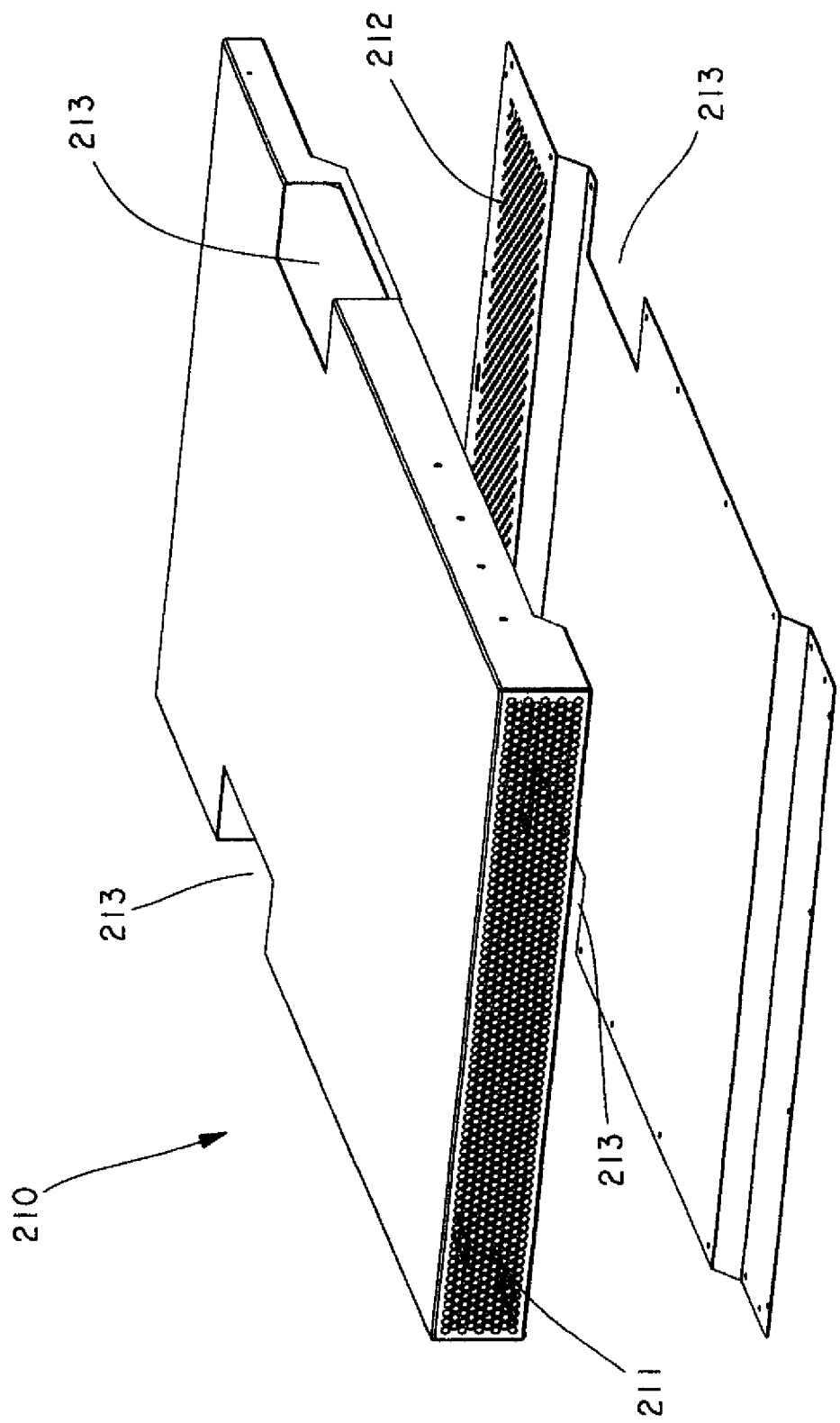
FIG. 15 is an exploded top front perspective view of a main duct for the cooling duct assembly of FIG. 12.

As best seen in FIG. 15, each of the main ducts 210 includes a perforated front panel 211, which allows cold air to enter the main duct 210, and a perforated bottom panel 212, which allows cold air to exit the main duct 210 and enter the back air plenum 260. Additionally, as best seen in FIG. 15, each of the main ducts 210 includes a pair of side duct openings 213, which allows cold air to exit the main duct 210 and enter the side ducts 220. The side duct openings 213 are adapted to receive the side ducts 220.

Figure 16:
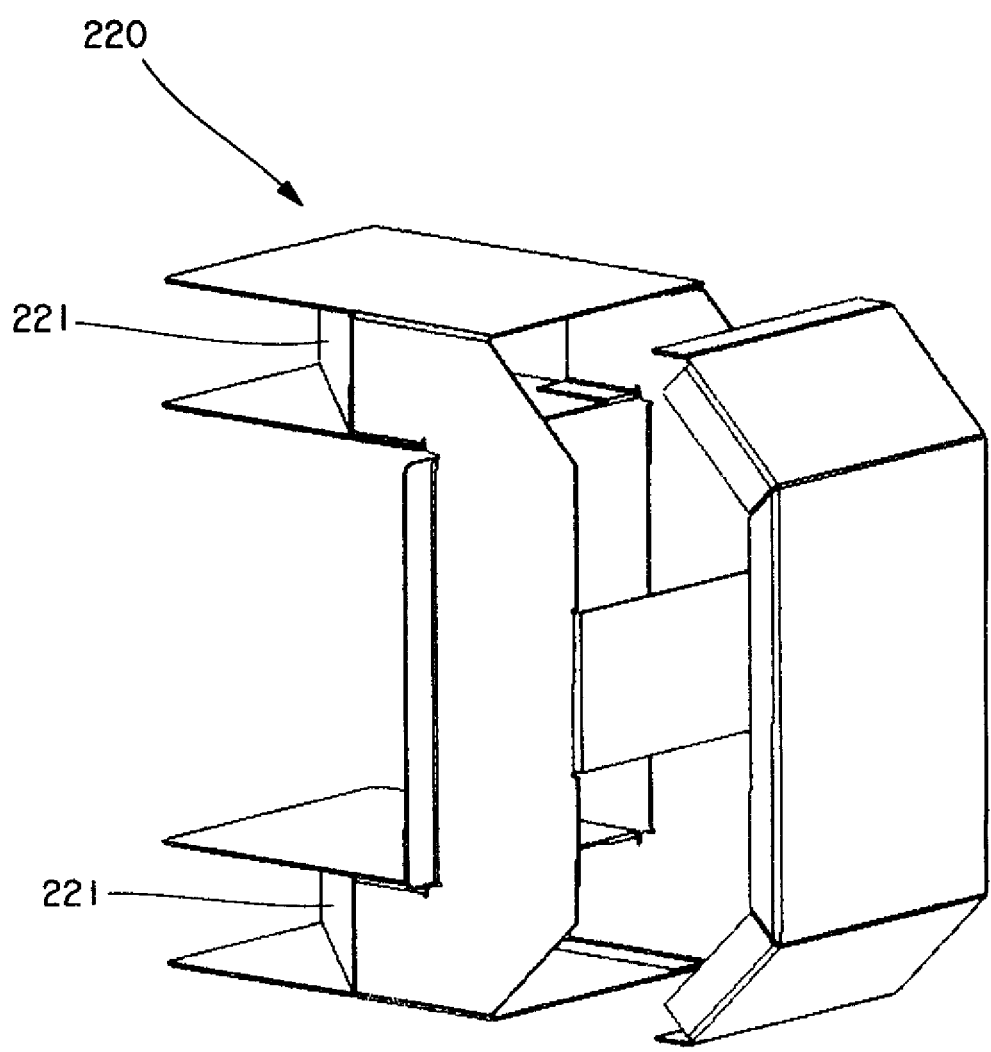
FIG. 16 is an exploded top back perspective view of a side duct for the cooling duct assembly of FIG. 12.
Figure 17:
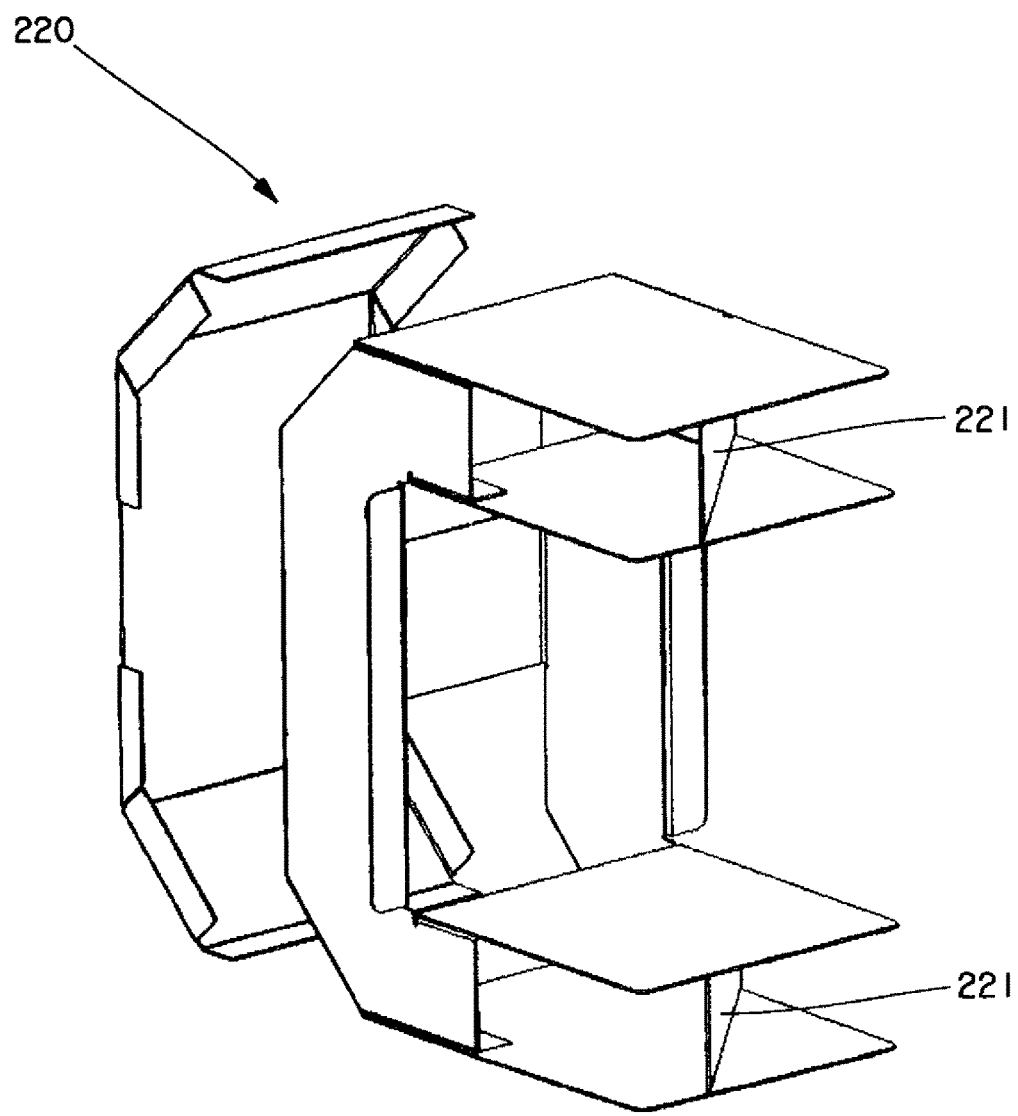
FIG. 17 is an exploded top front perspective view of a side duct for the cooling duct assembly of FIG. 12.

As best seen in FIG. 13 and FIG. 14, the side ducts 220 are disposed on the sides of the router 90. That is, the left side duct 220a is disposed on the left side of the router 90 and the right side duct 220b is disposed on the right side of the router 90. The side ducts 220 are aligned with the side air intake openings 92 of the router 90. As best seen in FIG. 16 and FIG. 17, the side ducts 220 include one or more baffles 221.

Figure 18:
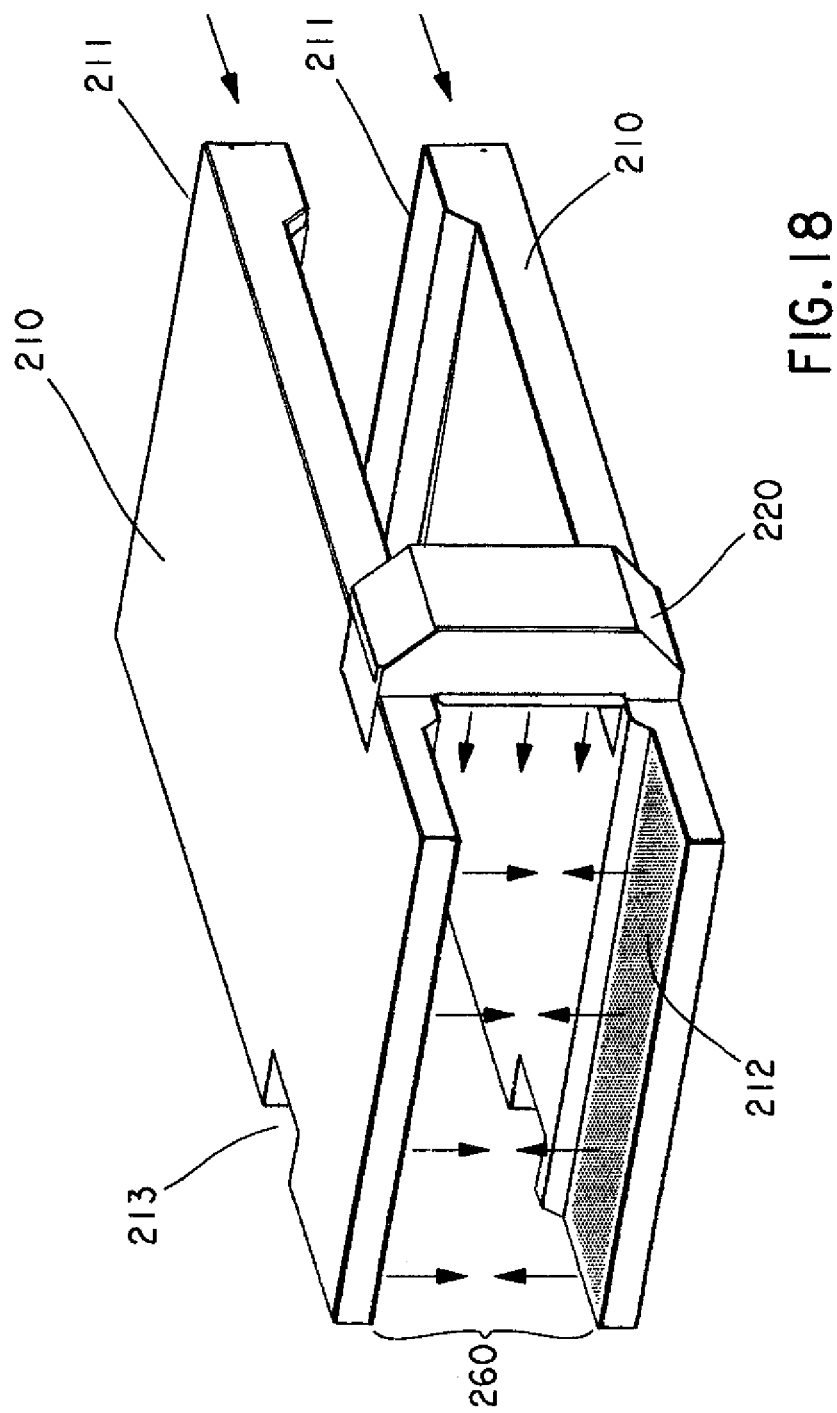
FIG. 18 is a top back perspective view of the cooling duct of FIG. 12, showing the airflow pattern through the main duct and one of the side ducts.

As best seen in FIG. 18, cold air, for example, from a cold aisle in a data center, enters the perforated front panels 211 of the main ducts 210. The cold air flows through the main ducts 210 and exits the perforated bottom panels 212 and the side openings 213. The cold air from the perforated bottom panels 212 enters the back air plenum 260. The cold air from the side openings 213 enters the side ducts 220 (only the left side duct 220a is shown).

Figure 19:
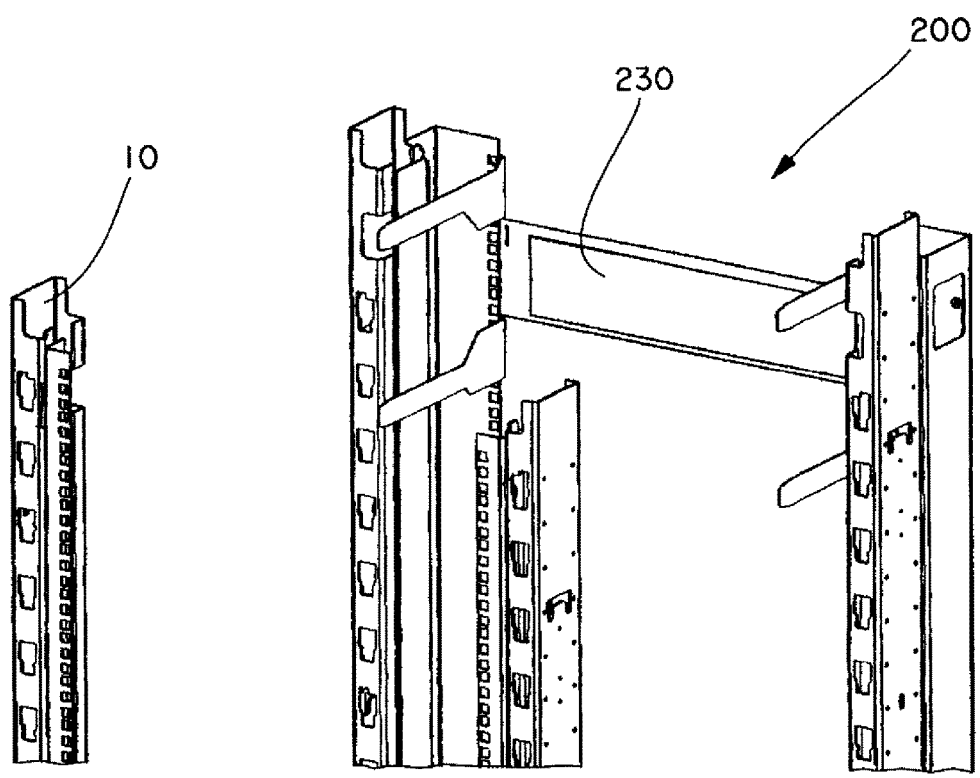
FIG. 19 is a top back perspective view of a front access door assembly for the cooling duct assembly of FIG. 12, showing the front access door assembly installed in a network cabinet.
Figure 20:
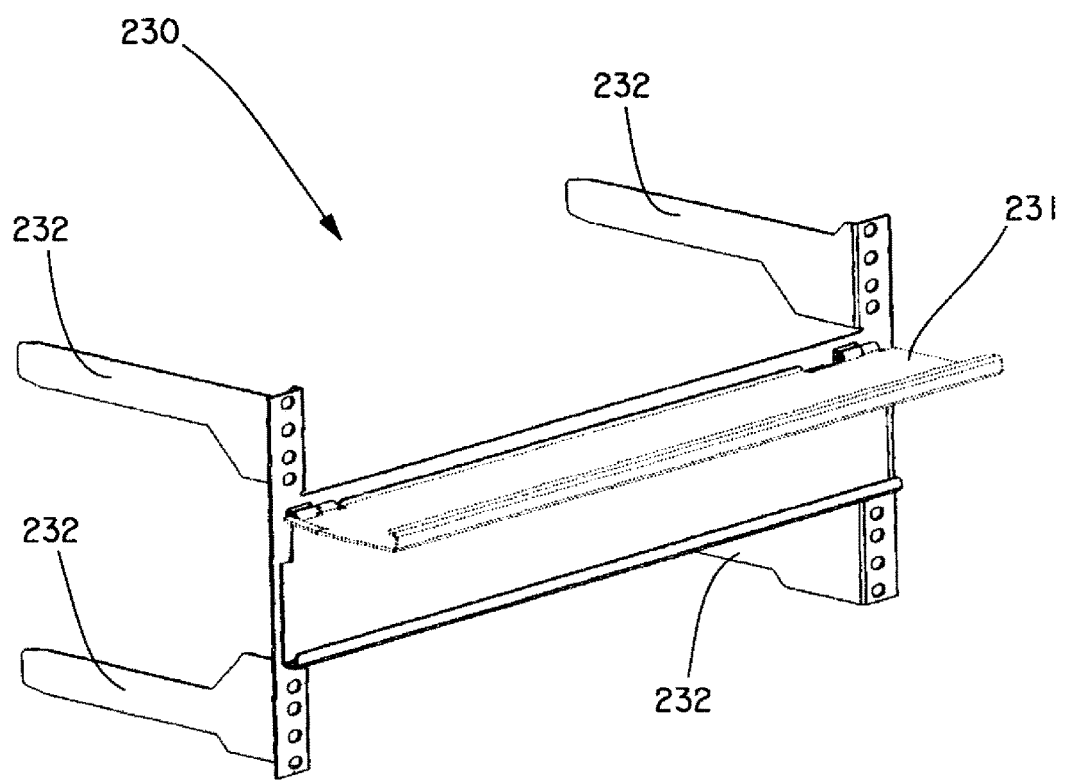
FIG. 20 is a top front perspective view of the front access door assembly of FIG. 19.

As best seen in FIG. 14, the front access door assembly 230 is associated with the front of the router 90. As best seen in FIG. 19, the front access door assembly 230 is secured to the front of the cabinet 10. As best seen in FIG. 20, the front access door assembly 230 includes a front access door 231 that rotates from an open position (FIG. 20), which allows access to the front of the router 90, to a closed position (FIG. 14), which restricts access to the front of the router 90 and further separates the front air exhaust openings 96 of the router 90, which is for hot air, from the front of the cabinet 10, which is for cold air. Additionally, the front access door assembly 230 includes one or more guides 232 for securing the main ducts 210 to the front access door assembly 230, and therefore, the cabinet 10.

Figure 21:
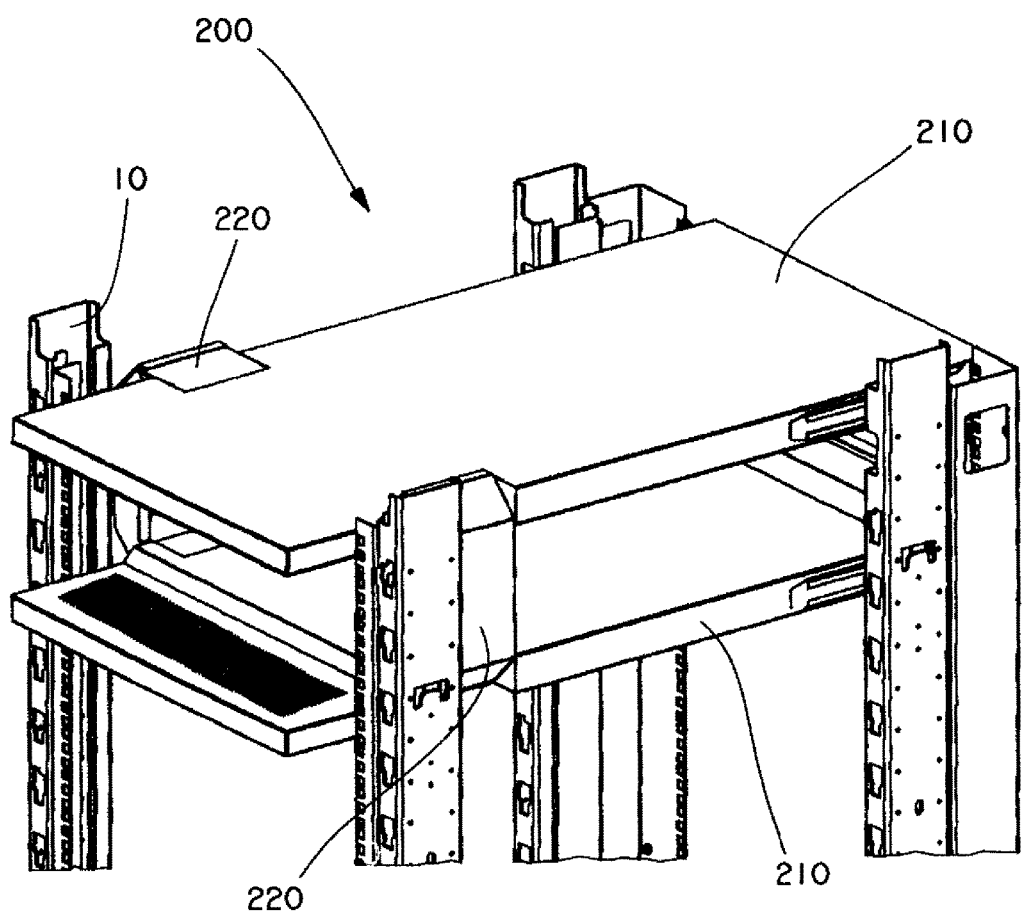
FIG. 21 is a top back perspective view of the cooling duct assembly of FIG. 12, showing the main ducts and the side ducts being installed in a network cabinet, the side ducts being in an inward position.
Figure 22:
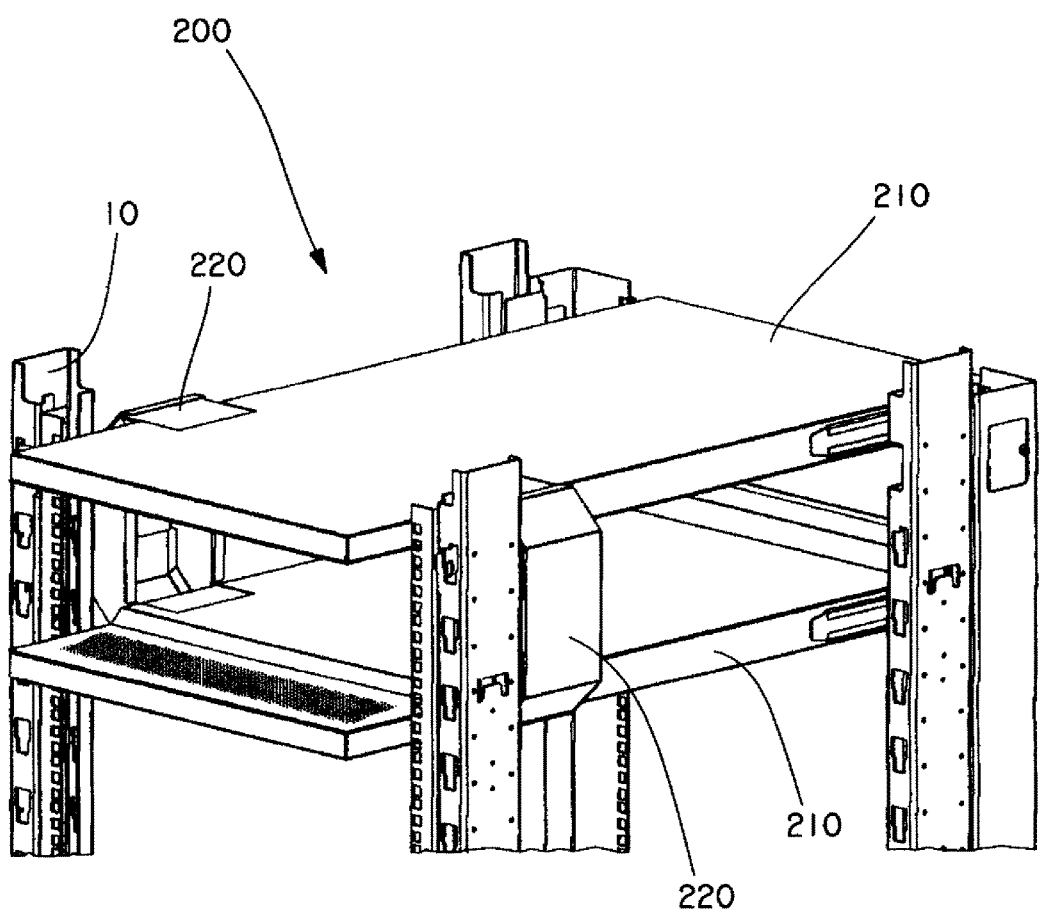
FIG. 22 is a top back perspective view of the cooling duct assembly of FIG. 12, showing the main ducts and the side ducts being installed in a network cabinet, the side ducts being in an outward position.

As best seen in FIG. 21, the main ducts 210 slidably engage the guides 232 on the front access door assembly 230, which secure the main ducts 210 to the cabinet 10. Additionally, as best seen in FIG. 21 and FIG. 22, the side ducts 220 slidably engage the side duct openings 213. That is, the side ducts 220 slide from an inward or retracted position (FIG. 21), which allows the main ducts 210 to be inserted into the cabinet 10, to an outward or extended position (FIG. 22), which allows the router 90 to be inserted into the cabinet 10 and between the main ducts 210. The extended position also allows cold air to flow more freely through the side ducts 220. If necessary, the side ducts 220 slide from the extended position (FIG. 22) to a partially inward or retracted position (FIG. 25), which allows the side ducts 220 to seal against the side air intake openings 92 of the router 90.

Figure 23:
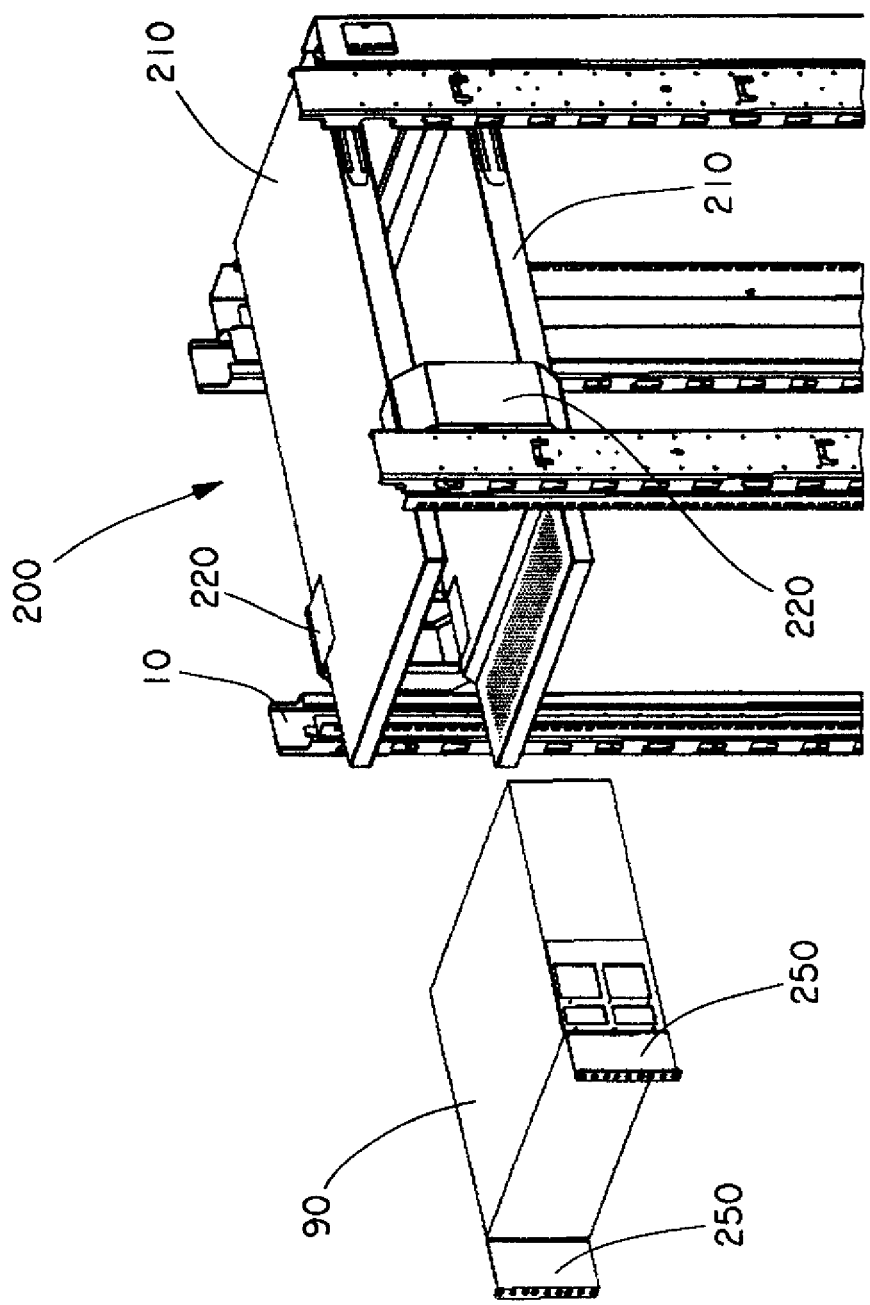
FIG. 23 is a top back perspective view of a pair of side brackets for the cooling duct assembly of FIG. 12, showing the side brackets installed on the router and being installed in a network cabinet.
Figure 24:
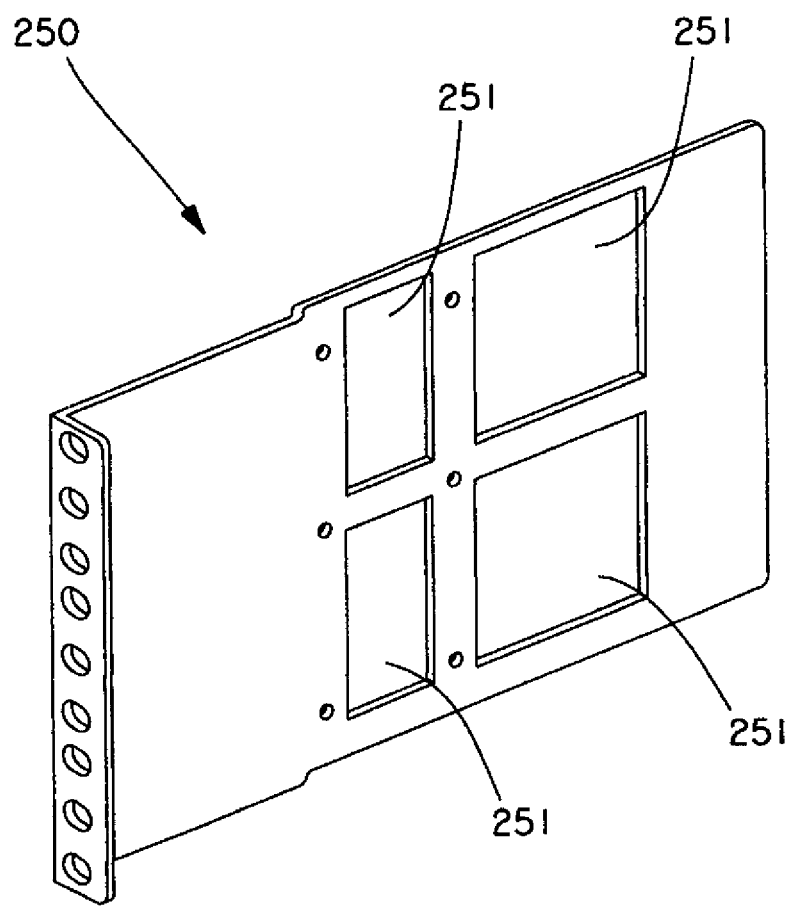
FIG. 24 is a top back perspective view of one of the side brackets of FIG. 23.

As best seen in FIG. 23, the side brackets 250 secure the router 90 to the cabinet 10. As best seen in FIG. 24, the side brackets 250 include one or more windows 251, which are aligned with the side air intake openings 92 of the router 90. The windows 251 allow cold air to flow from the side ducts 220 and into the side air intake openings 92 of the router 90.

Figure 25:
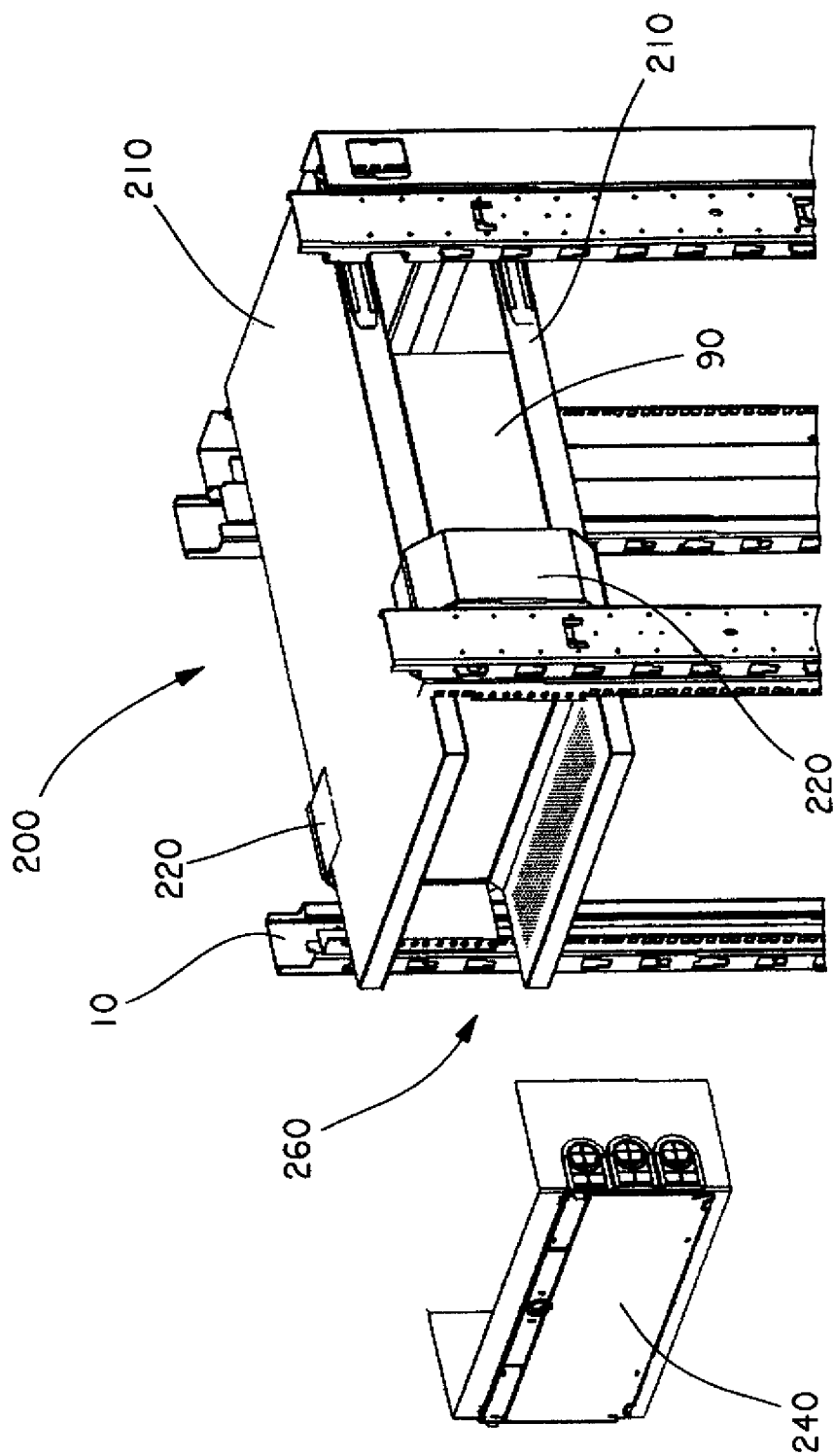
FIG. 25 is a top back perspective view of a back access door assembly for the cooling duct assembly of FIG. 12, showing the back access door assembly being installed in a network cabinet.
Figure 26:
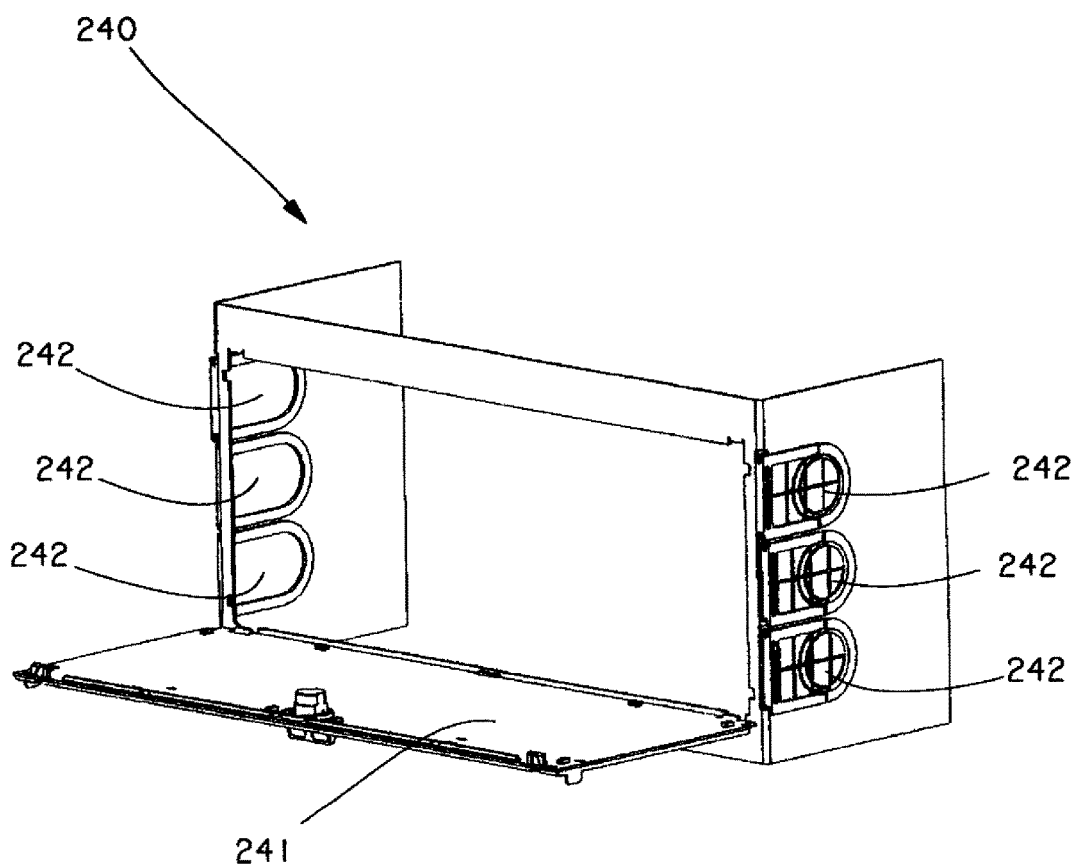
FIG. 26 is a top back perspective view of the back access door assembly of FIG. 25.

As best seen in FIG. 25, the back access door assembly 240 is associated with the back of the router 90. The back access door assembly 240 encloses the back air plenum 260. As best seen in FIG. 26, the back access door assembly 240 includes a back access door 241 that rotates from an open position (FIG. 26), which allows access to the back of the router 90, to a closed position (FIG. 12), which restricts access to the back of the router 90 and further separates the back of the cabinet 10, which is for hot air, from the back air intake openings 94 of the router 90 and the back air plenum 260, which are for cold air. Additionally, as best seen in FIG. 26, the back access door assembly 240 includes one or more grommets 242 for routing cables to the back of the router 90.

As best seen in FIG. 27 and FIG. 28, cold air, for example, from a cold aisle of a data center, enters the main ducts 210. The cold air flows through the main ducts 210 and into the side ducts 220 and the back air plenum 260. The cold air from the side ducts 220 enters the side air intake openings 92 of the router 90. Additionally, the cold air from the back air plenum 260 enters the back air intake openings 94 of the router 90. Hot air exits the front air exhaust openings 96 of the router 90. The front access door assembly 230 prevents (or at least minimizes) mixing of the hot air with cold air in the front of the cabinet 10. Rather, the hot air flows around the sides of the cabinet 10. Preferably, the hot air exits the cabinet 10 through a chimney, such as the chimney 110 of the passive cooling system 100 (FIGS. 1-9), but it is likewise contemplated that the hot air exits the cabinet 10 through one or more openings in the back of the cabinet 10, for example, to a hot aisle in the data center. The back access door assembly 240 prevents (or at least minimizes) mixing of the hot air with cold air in the back air plenum 260.

While the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation. The illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

The invention claimed is:

1. A cooling duct and electronic equipment assembly for installation in a cabinet, the cooling duct and electronic equipment assembly comprising:
   electronic equipment configured to have cool air enter at least one inlet located on a side of the equipment and hot air exit the equipment towards a font of the assembly, the front of the assembly being a portion of the assembly closest to a front of the cabinet when the assembly is installed within the cabinet;
   at least one main duct extending from a front portion of the cabinet to a back portion of the cabinet, the at least one main duct in fluid communication with the front portion of the cabinet, wherein the at least one main duct receives cold air from the front portion of the cabinet and routes the cold air toward a back portion of the cabinet;

a first side duct in fluid communication with a first side of the at least one main duct, wherein the first side duct receives a first portion of the cold air from the at least one main duct and routes the first portion of the cold air to a first air intake opening on a first side of the electronic equipment; and a second side duct in fluid communication with a second side of the at least one main duct, wherein the second side duct receives a second portion of the cold air from the at least one main duct and routes the second portion of the cold air to a second air intake opening on a second side of the electronic equipment, wherein the second side of the electronic equipment is opposite the first side of the electronic equipment.

2. The cooling duct and electronic equipment assembly of claim 1, wherein the at least one main duct is disposed above or below the electronic equipment.

3. The cooling duct and electronic equipment assembly of claim 1, wherein the at least one main duct extends beyond the front portion of the electronic equipment.

4. The cooling duct and electronic equipment assembly of claim 3, wherein the at least one main duct extends beyond the back portion of the electronic equipment.

5. The cooling duct and electronic equipment assembly of claim 1, wherein the at least one main duct includes a perforated front panel.

6. The cooling duct and electronic equipment assembly of claim 1, wherein the at least one main duct includes a perforated bottom panel.

7. The cooling duct and electronic equipment assembly of claim 1, wherein the at least one main duct includes at least one side duct opening.

8. The cooling duct and electronic equipment assembly of claim 1, wherein the first side duct includes at least one baffle.

9. The cooling duct and electronic equipment assembly of claim 1, further comprising a first side bracket for securing the electronic equipment to the cabinet, wherein the first side bracket includes at least one window aligned with the first air intake opening on the first side of the electronic equipment.

10. The cooling duct and electronic equipment assembly of claim 1, further comprising a front access door assembly associated with the at least one front air exhaust opening of the electronic equipment, wherein the front access door assembly separates hot air exiting the at least one front air exhaust opening on the electronic, equipment and the cold air in the front portion of the cabinet.

11. The cooling duct and electronic equipment assembly of claim 10, wherein the front access door assembly includes a front access door, wherein the front access door rotates from an open position, which allows access to the front portion of the electronic equipment, to a closed position, which restricts access to the front portion of the electronic equipment and further separates the hot air exiting the at least one front air exhaust opening on the electronic equipment and the cold air in the front portion of the cabinet.

12. The cooling duct and electronic equipment assembly of claim 10, wherein the front access door assembly includes at least one guide, wherein the at least one main duct slidably engages the at least one guide.

13. The cooling duct and electronic equipment assembly of claim 1, wherein the electronic equipment includes at least one of a router and a switch.

\* \* \* \* \*